US012690426B2

(12) United States Patent
Huang

(10) Patent No.: US 12,690,426 B2
(45) Date of Patent: Jul. 21, 2026

(54) SEMICONDUCTOR STRUCTURE FOR DETECTING VERTICAL ELECTRICAL LEAKAGE

(71) Applicant: NANYA TECHNOLOGY CORPORATION, New Taipei City (TW)

(72) Inventor: Chun-Shun Huang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 913 days.

(21) Appl. No.: 17/853,973

(22) Filed: Jun. 30, 2022

(65) Prior Publication Data

US 2024/0006252 A1     Jan. 4, 2024

(51) Int. Cl.
*H10P 74/00*          (2026.01)

(52) U.S. Cl.
CPC .......... *H10P 74/273* (2026.01); *H10P 74/277* (2026.01)

(58) Field of Classification Search
CPC ........ H01L 22/32; H01L 22/34; H10P 74/273; H10P 74/277
See application file for complete search history.

(56) References Cited

U.S. PATENT DOCUMENTS

| | | | | |
|---|---|---|---|---|
| 8,021,897 | B2 * | 9/2011 | Sills ...................... | H10B 63/80 |
| | | | | 438/129 |
| 8,207,557 | B2 | 6/2012 | Sills et al. | |
| 9,431,412 | B1 * | 8/2016 | Kato ...................... | H10B 41/35 |
| 10,026,895 | B2 * | 7/2018 | Kamata .............. | H10N 70/8828 |
| 10,541,302 | B2 * | 1/2020 | Yoon ..................... | H10D 62/115 |
| 10,677,855 | B2 * | 6/2020 | Licausi ............. | H01L 21/31138 |
| 10,847,540 | B2 | 11/2020 | Or-Bach et al. | |
| 2011/0187382 | A1 | 8/2011 | Martin et al. | |
| 2011/0210306 | A1 * | 9/2011 | Li ........................ | H10N 70/821 |
| | | | | 257/3 |

FOREIGN PATENT DOCUMENTS

TW          326105 B     2/1998

OTHER PUBLICATIONS

Office Action and and the search report mailed on Dec. 23, 2024 related to U.S. Appl. No. 17/854,561.
1 Office Action and Search Report mailed on Feb. 22, 2024 related to Taiwanese Application No. 112114613.

* cited by examiner

*Primary Examiner* — Yara B Green
*Assistant Examiner* — Benjamin Michael Kupp
(74) *Attorney, Agent, or Firm* — Xuan Zhang

(57)          ABSTRACT

A semiconductor testing structure is provided. The semiconductor testing structure includes a substrate, a first metal layer, a dielectric structure, and a second metal layer. The first metal layer is disposed on the substrate and includes a plurality of fingers extending along a first direction. The dielectric structure is disposed on the first metal layer. The second metal layer is disposed on the dielectric structure and electrically isolated from the first metal layer. The second metal layer extends along a second direction different from the first direction. The dielectric structure defines a sidewall extending between the first metal layer and the second metal layer.

3 Claims, 28 Drawing Sheets

A' — A

160

152 } 150
151

140

141

130

120

110

100a

Z ← X

100a
B'
160
152 ⎫
   ⎬ 150
151 ⎭
141
130
120
110
140
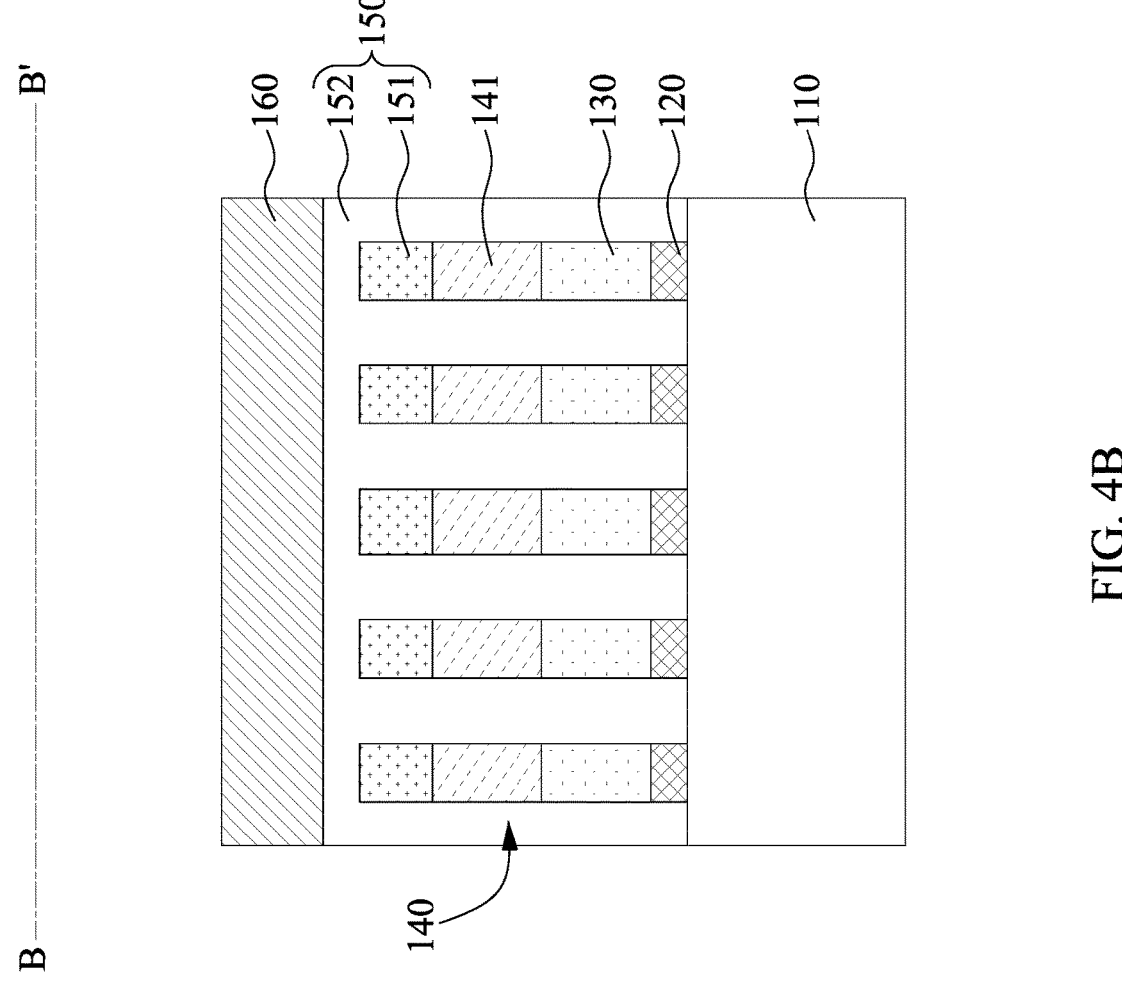
B
FIG. 4B
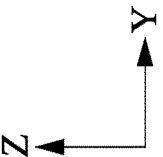
Y
Z

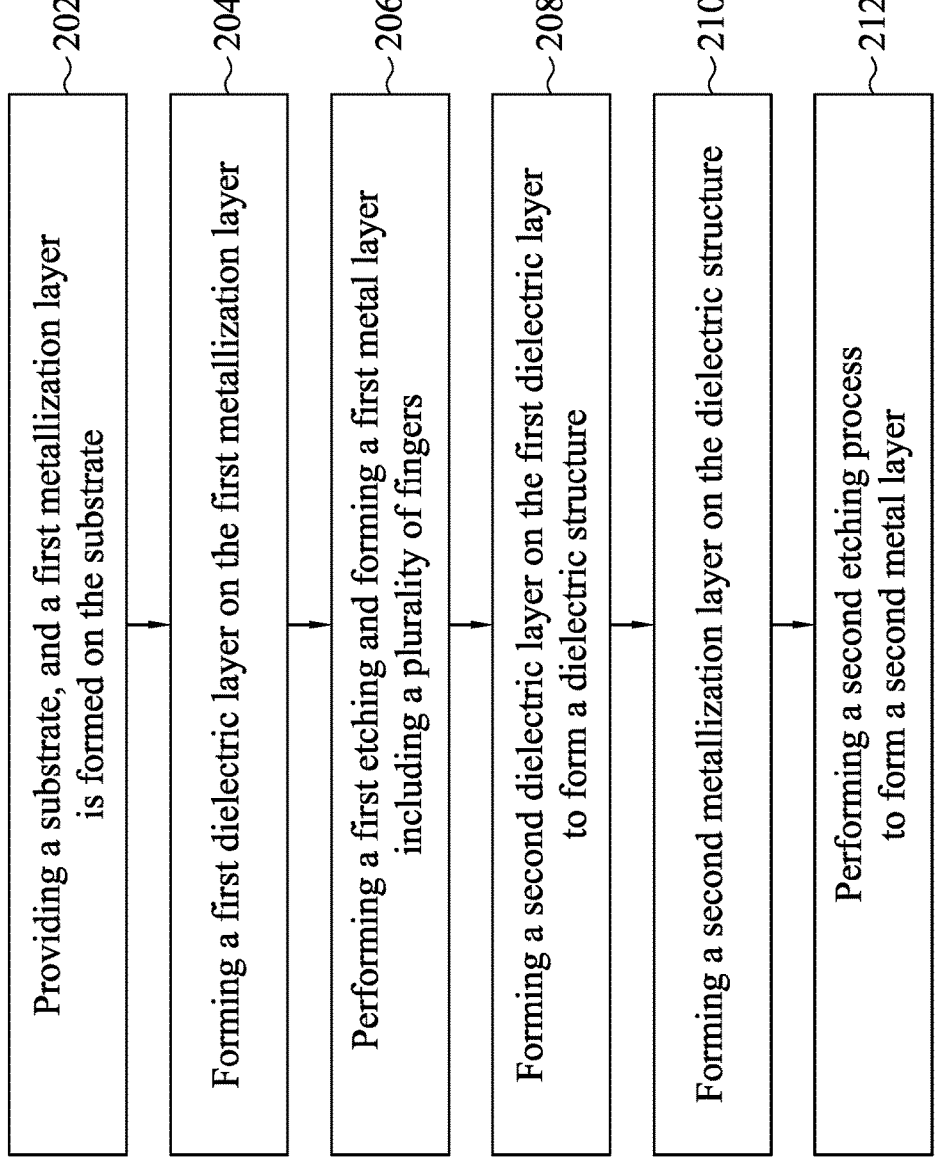

200

202 Providing a substrate, and a first metallization layer is formed on the substrate 204 Forming a first dielectric layer on the first metallization layer 206 Performing a first etching and forming a first metal layer including a plurality of fingers 208 Forming a second dielectric layer on the first dielectric layer to form a dielectric structure 210 Forming a second metallization layer on the dielectric structure 212 Performing a second etching process to form a second metal layer

FIG. 8

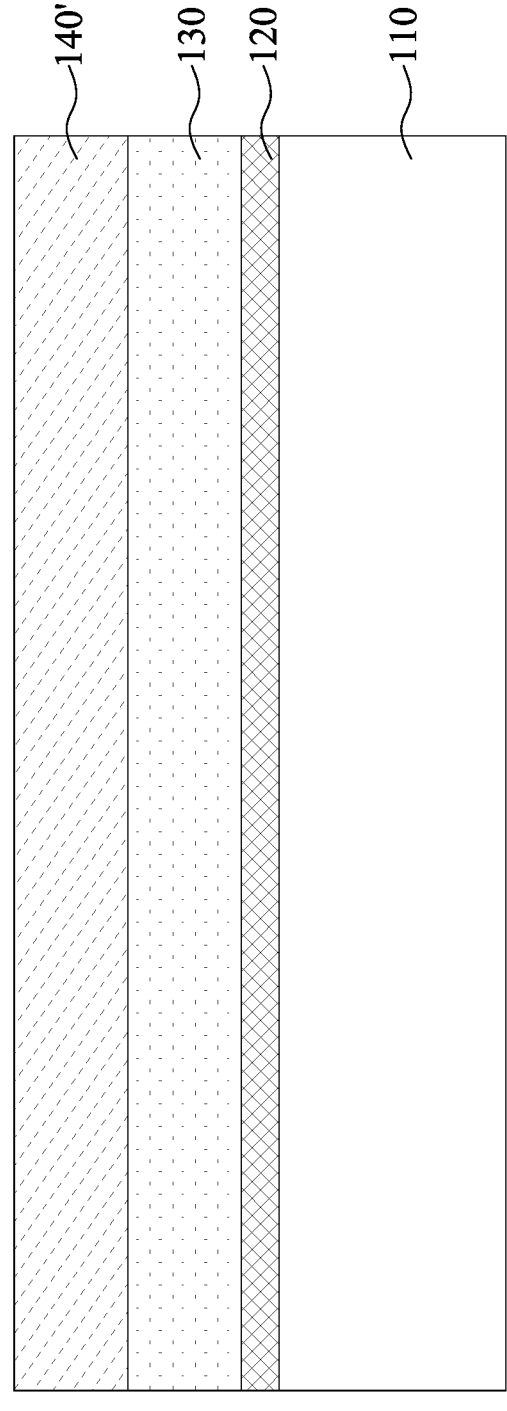
140'
130
120
110
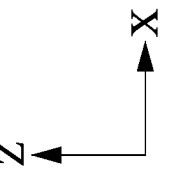
X
Z
FIG. 9A

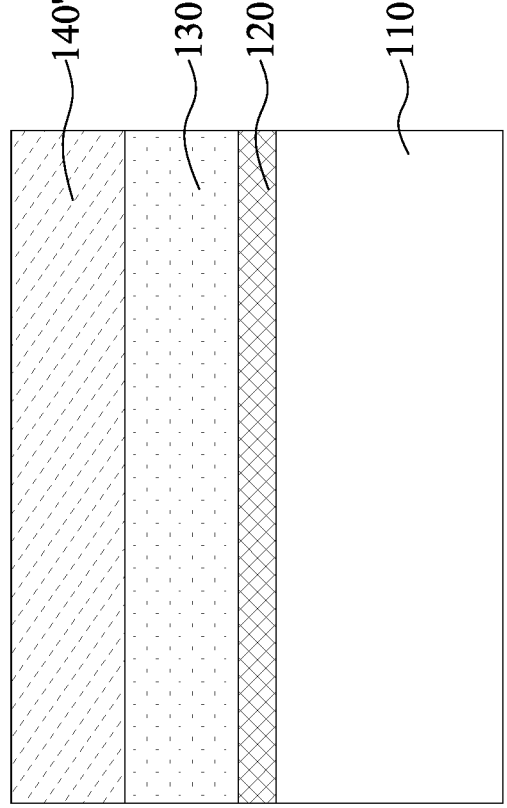
140'
130
120
110
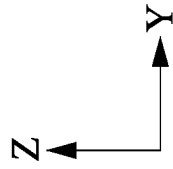
FIG. 9B

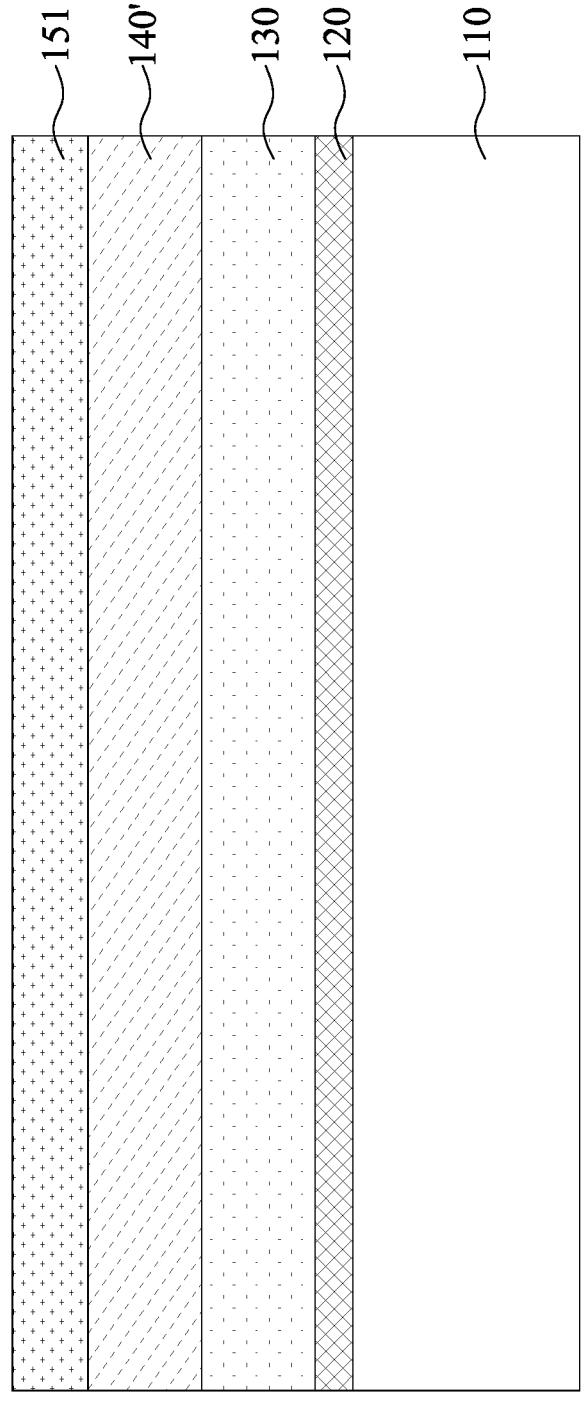
151
140'
130
120
110
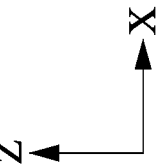
FIG. 10A

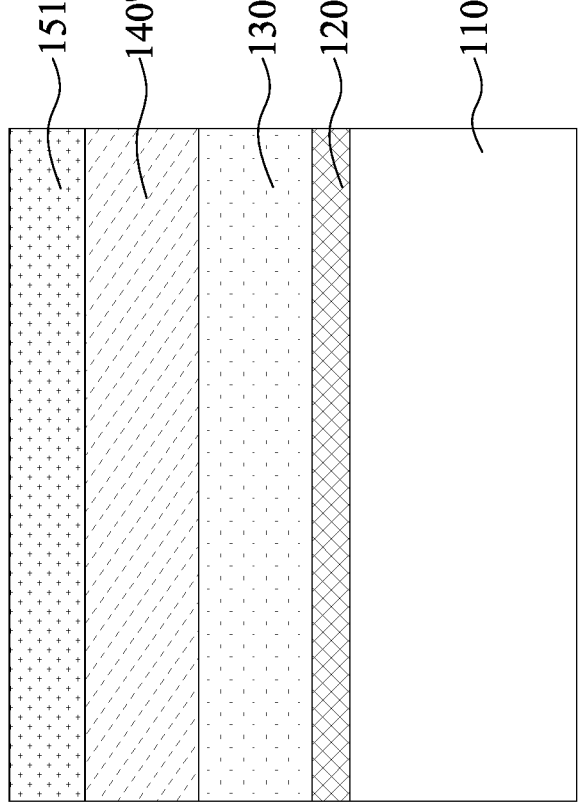
151
140'
130
120
110
FIG. 10B
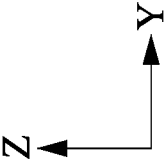

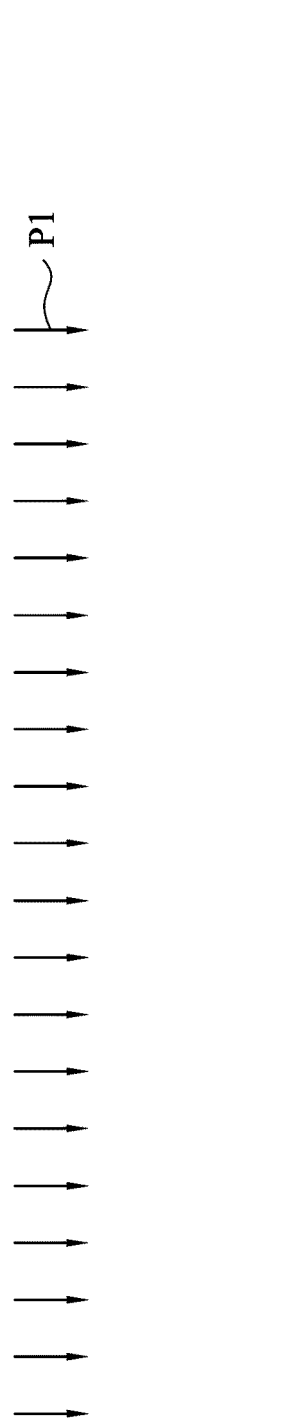
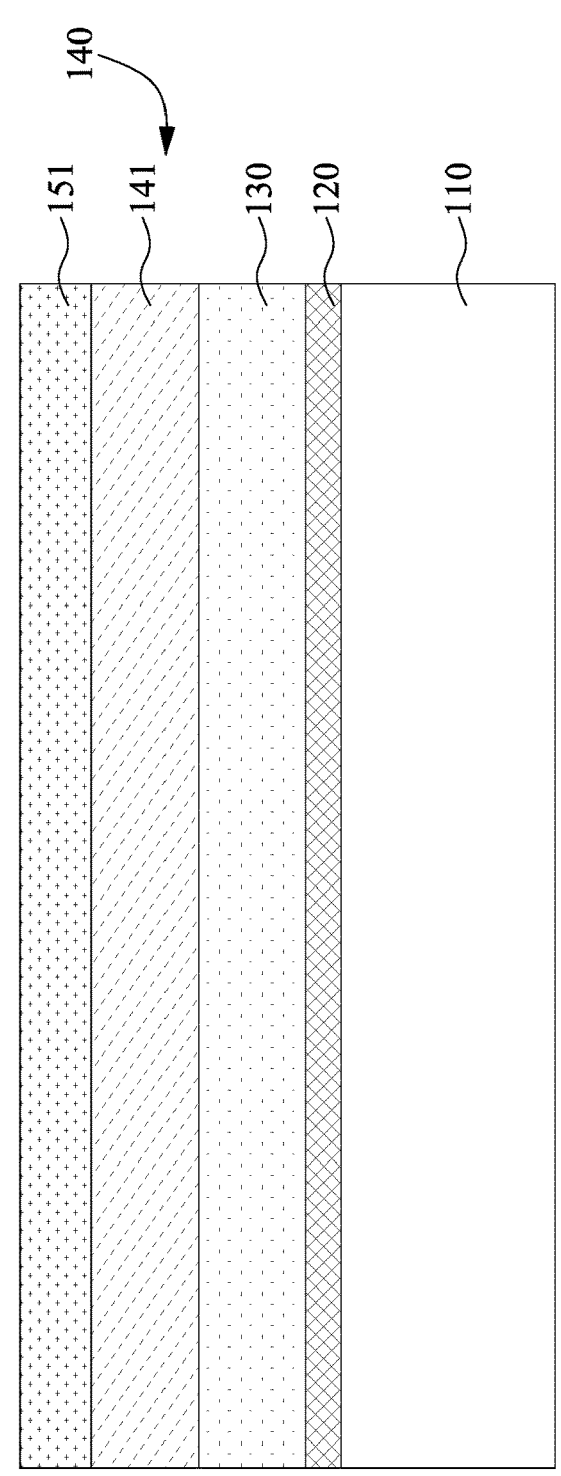
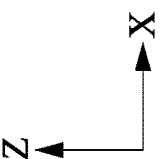
FIG. 11A

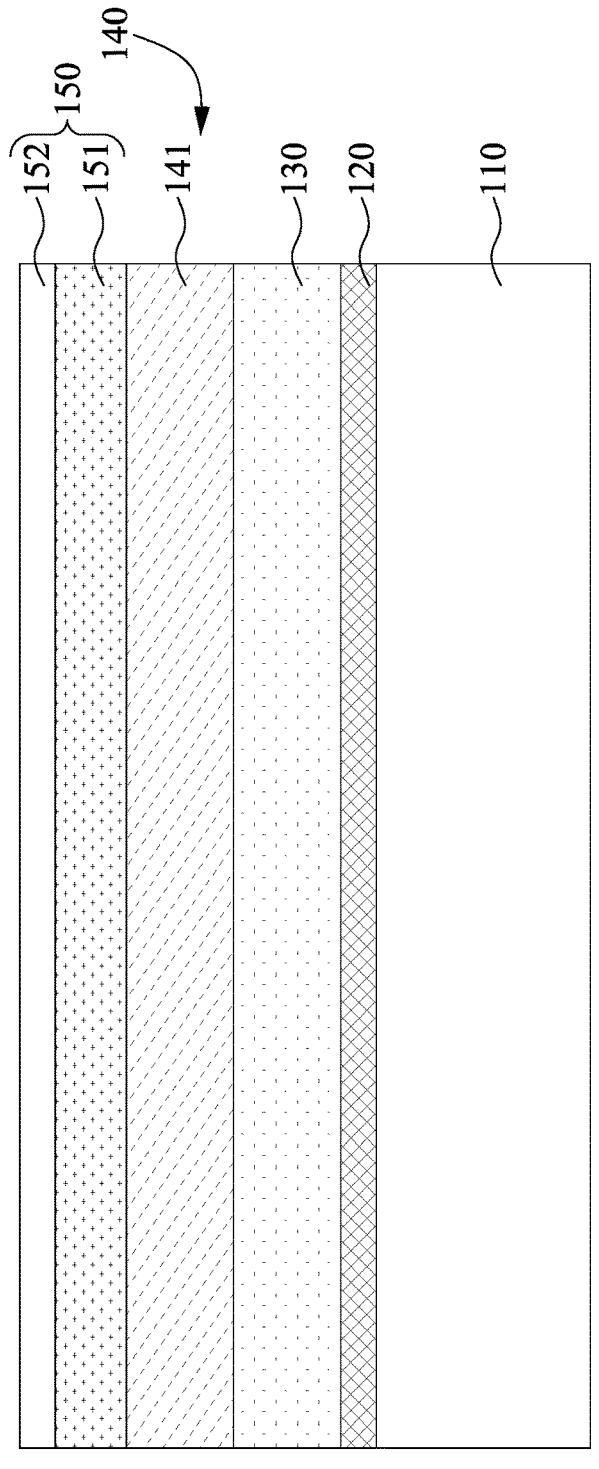
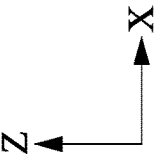
FIG. 12A

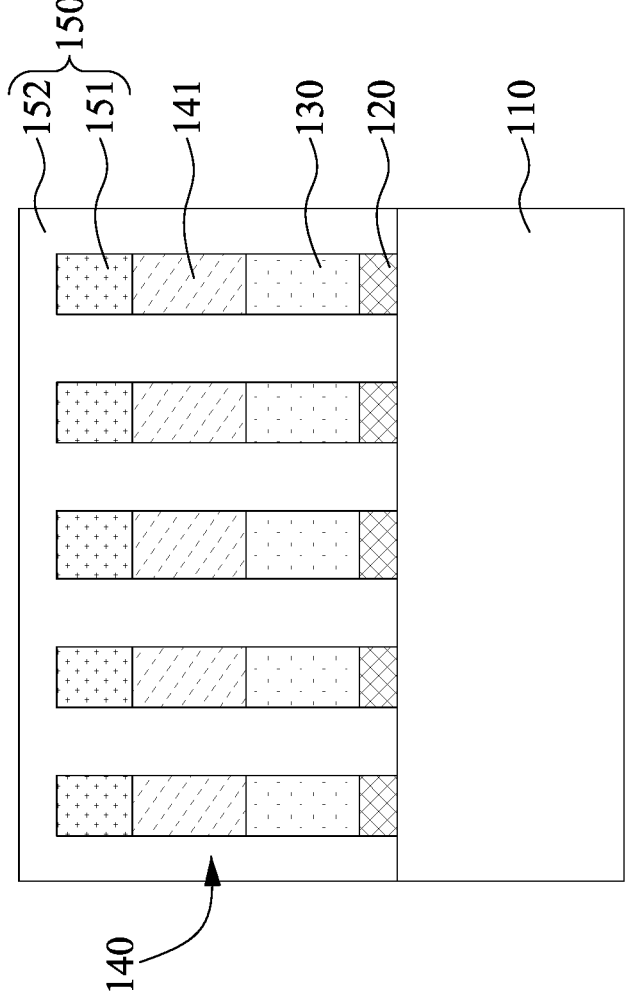
152
151
150
141
130
120
110
140
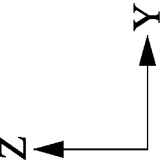
FIG. 12B
Z
Y

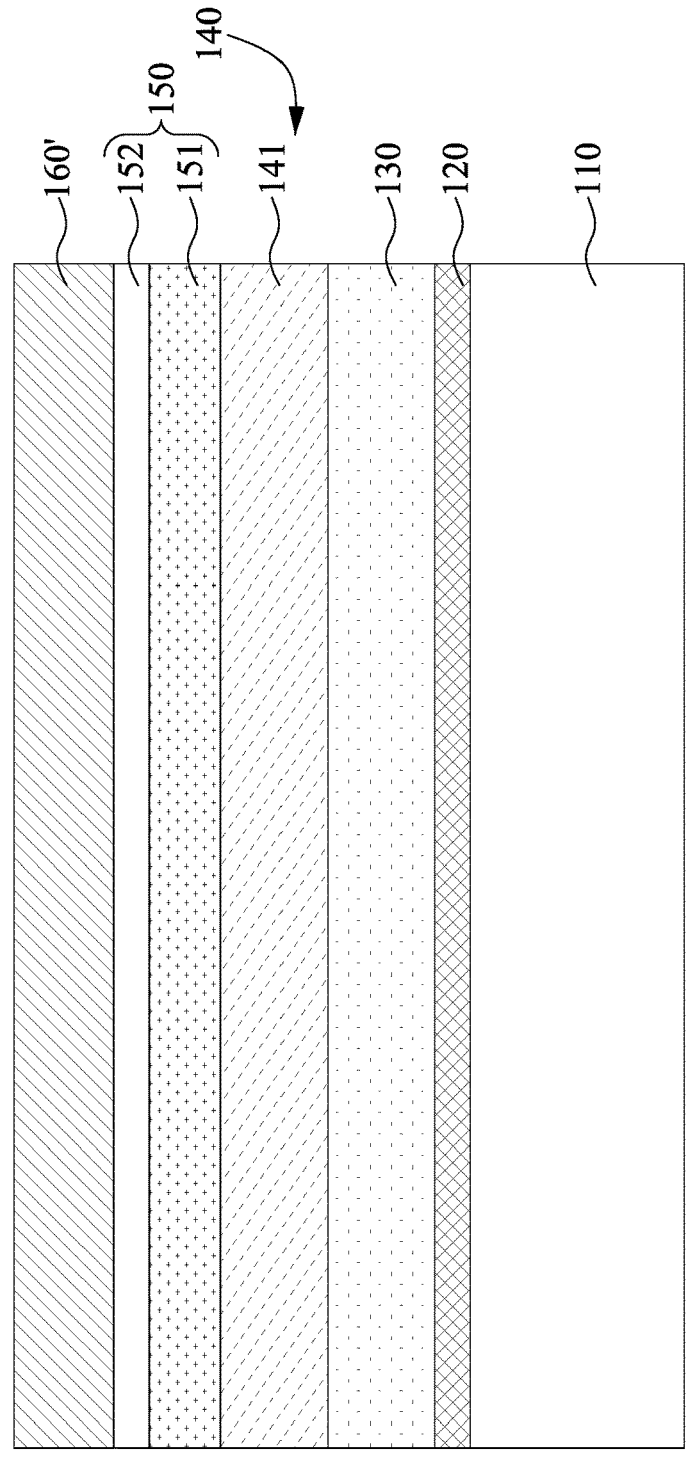
160'
152
150
151
140
141
130
120
110
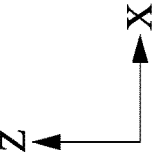
FIG. 13A

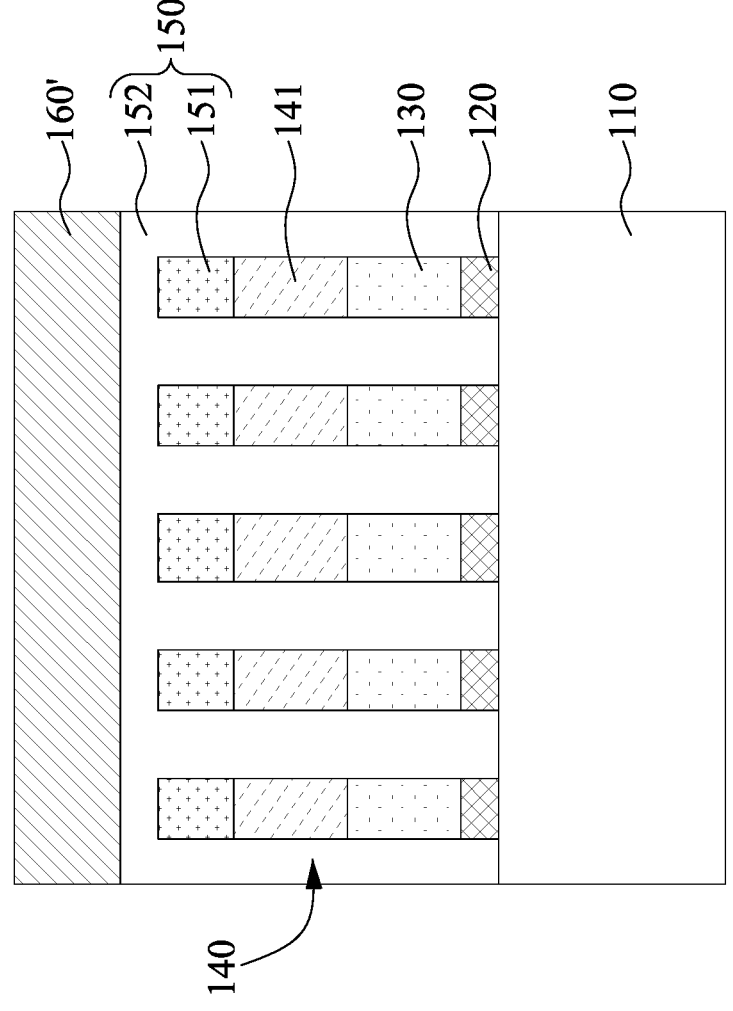
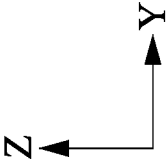
FIG. 13B

100a

P2

160

152 } 150
151

140

141

130

120

110

X

Z

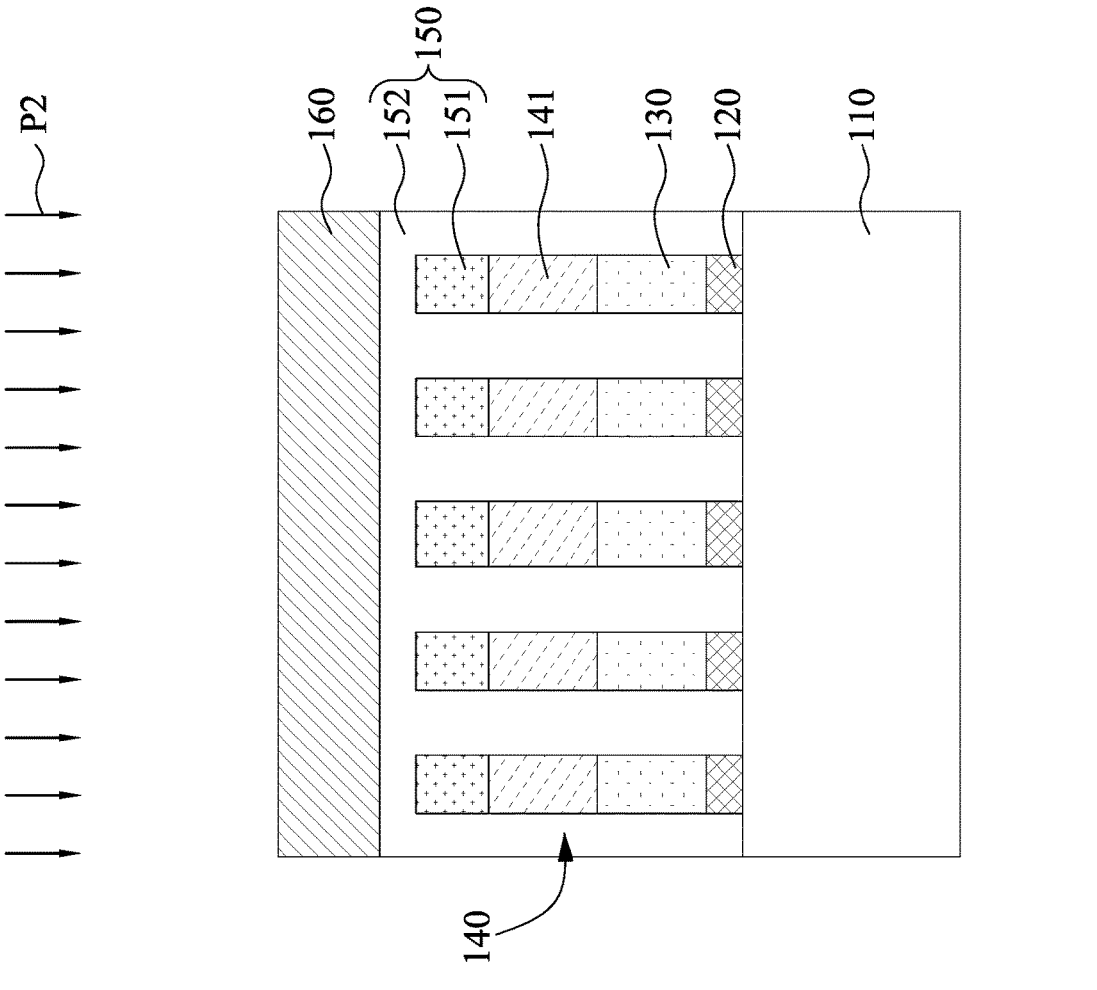
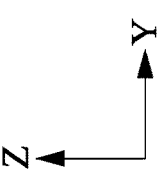
FIG. 14B

Continuing the second etching process to remove a portion of the second dielectric layer ⌐302

Continuing the second etching process to remove a portion of the first dielectric layer ⌐304

Forming a conductive layer ⌐306

300

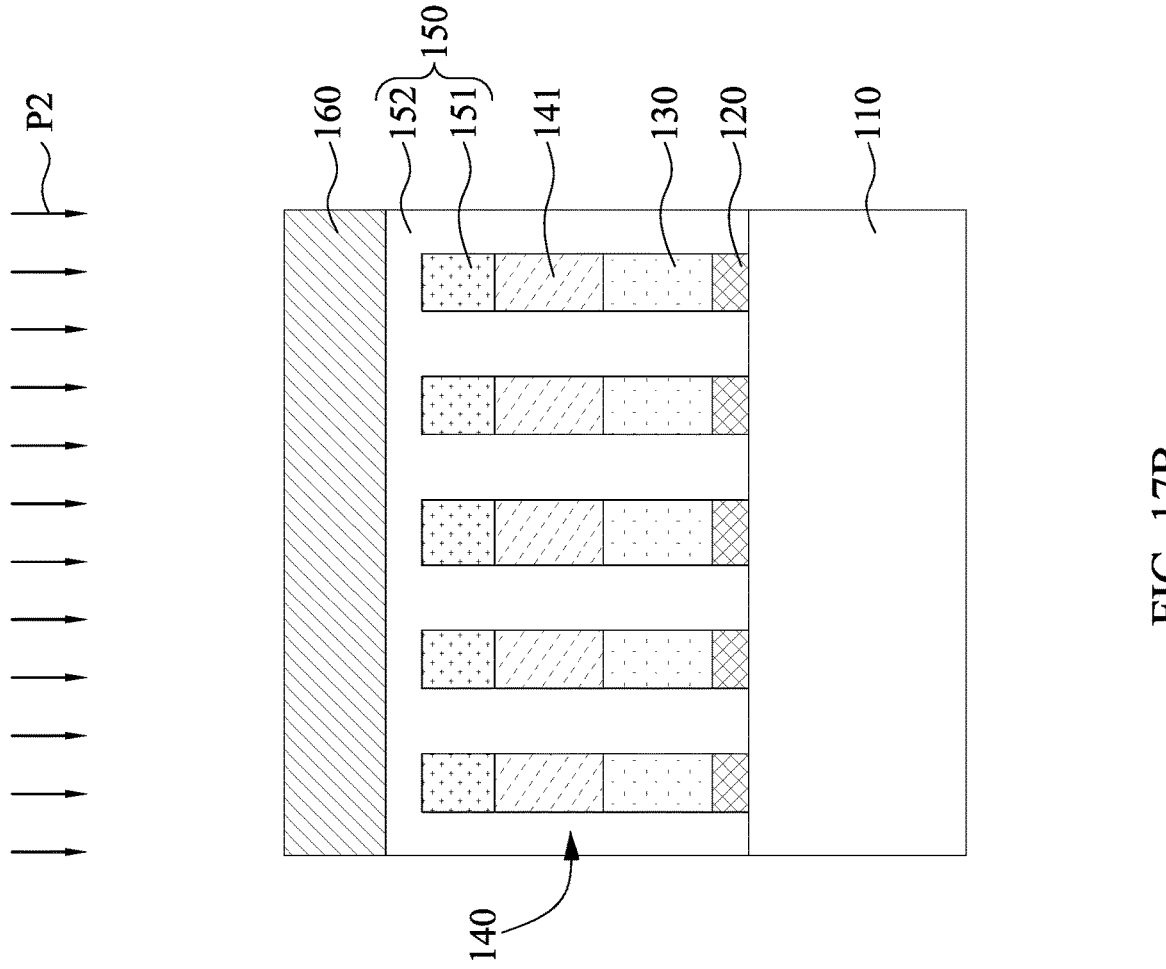
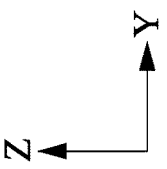
FIG. 17B

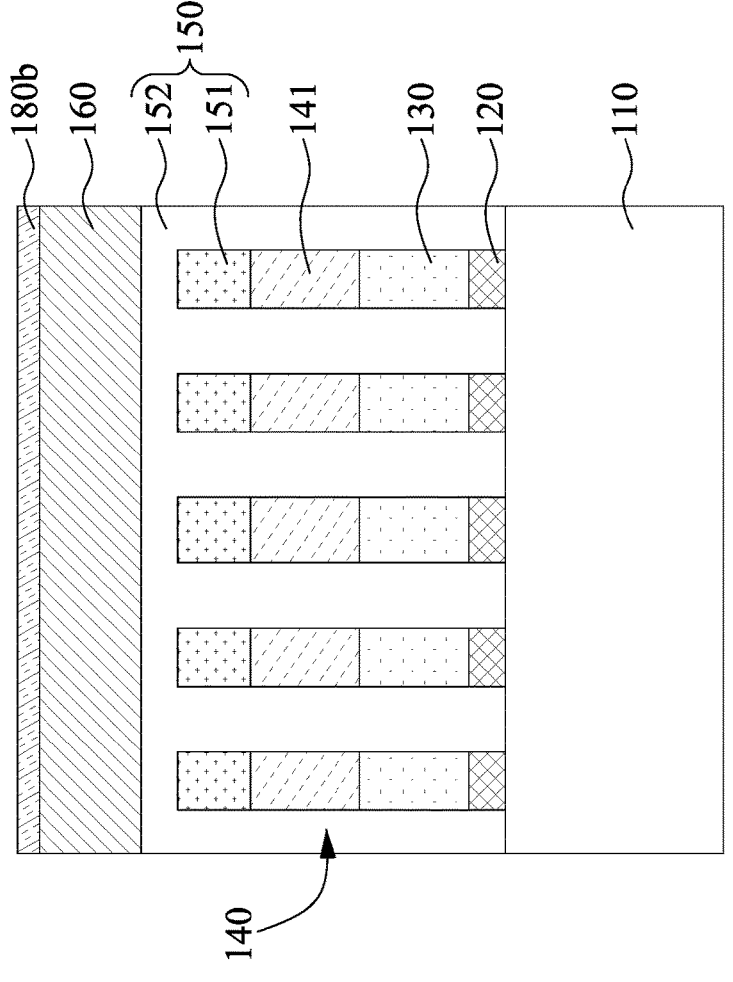
100c
180b
160
152
150
151
141
130
120
110
140
FIG. 18B
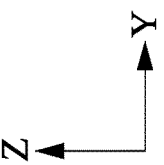
Z
Y

SEMICONDUCTOR STRUCTURE FOR DETECTING VERTICAL ELECTRICAL LEAKAGE

TECHNICAL FIELD

The present disclosure relates to a semiconductor structure and method of manufacturing the same, and more particularly, to a semiconductor testing structure configured to detect vertical electrical leakage.

DISCUSSION OF THE BACKGROUND

With the rapid growth of the electronics industry, integrated circuits (ICs) have achieved high performance and miniaturization. Technological advances in IC materials and design have produced generations of ICs with smaller and more complex circuits.

During formation of conductive traces, such as zero metal (M0) or first metal (M1) layers, multiple semiconductor manufacturing processes, such as etching and lithography, are performed to pattern metallization layers. In some cases, dielectric layers beneath the metallization layer may be over-etched, which causes residue from the metallization layer, the result of corrosion, to connect metal layers at different horizontal levels and generate vertical electrical leakage. In order to solve the problem, a new semiconductor testing structure is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor testing structure. The semiconductor testing structure includes a substrate, a first metal layer, a dielectric structure, and a second metal layer. The first metal layer is disposed on the substrate and includes a plurality of fingers extending along a first direction. The dielectric structure is disposed on the first metal layer. The second metal layer is disposed on the dielectric structure and electrically isolated from the first metal layer. The second metal layer extends along a second direction different from the first direction. The dielectric structure defines a sidewall extending between the first metal layer and the second metal layer.

Another aspect of the present disclosure provides another method of manufacturing a semiconductor testing structure. The semiconductor testing structure includes a substrate, a first metal layer, a dielectric structure, and a plurality of second metal layers. The first metal layer includes a plurality of fingers extending along a first direction. The dielectric structure is disposed on the first metal layer. Each of the plurality of second metal layers extends along a second direction different form the first direction.

Another aspect of the present disclosure provides a method of manufacturing a semiconductor testing structure. The method includes: providing a substrate; forming a first metal layer on the substrate, wherein the first metal layer comprises a plurality of fingers extending along a first direction; forming a dielectric structure on the first metal layer; and forming a plurality of second metal layers on the dielectric structure, wherein the first metal layer comprises a plurality of fingers extending along a first direction.

Embodiments of the present disclosure provide a semiconductor testing structure, which may be utilized to detect electrical leakage between metal layers at different horizontal levels. For example, the semiconductor testing structure may be utilized to detect electrical leakage between a bit line and the zero metal (M0) layer, which are included in a semiconductor device or in a die. When vertical electrical leakage is detected from the semiconductor testing structure, the process condition may be correspondingly adjusted, thereby optimizing the semiconductor manufacturing process.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 4B is a cross-sectional view along line B-B' of the semiconductor testing structure as shown in FIG. 3, in accordance with some embodiments of the present disclosure.

FIG. 8 is a flowchart illustrating a method of manufacturing a semiconductor testing structure, in accordance with some embodiments of the present disclosure.

FIG. 9A and FIG. 9B illustrate one or more stages of an exemplary method of manufacturing a semiconductor testing structure according to some embodiments of the present disclosure.

FIG. 10A and FIG. 10B illustrate one or more stages of an exemplary method of manufacturing a semiconductor testing structure according to some embodiments of the present disclosure.

FIG. 11A and FIG. 11B illustrate one or more stages of an exemplary method of manufacturing a semiconductor testing structure according to some embodiments of the present disclosure.

FIG. 12A and FIG. 12B illustrate one or more stages of an exemplary method of manufacturing a semiconductor testing structure according to some embodiments of the present disclosure.

FIG. 13A and FIG. 13B illustrate one or more stages of an exemplary method of manufacturing a semiconductor testing structure according to some embodiments of the present disclosure.

FIG. 14A and FIG. 14B illustrate one or more stages of an exemplary method of manufacturing a semiconductor testing structure according to some embodiments of the present disclosure.

FIG. 17A and FIG. 17B illustrate one or more stages of an exemplary method of manufacturing a semiconductor testing structure according to some embodiments of the present disclosure.

FIG. 18A and FIG. 18B illustrate one or more stages of an exemplary method of manufacturing a semiconductor testing structure according to some embodiments of the present disclosure.

DETAILED DESCRIPTION

Figure 1:
FIG. 1 is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
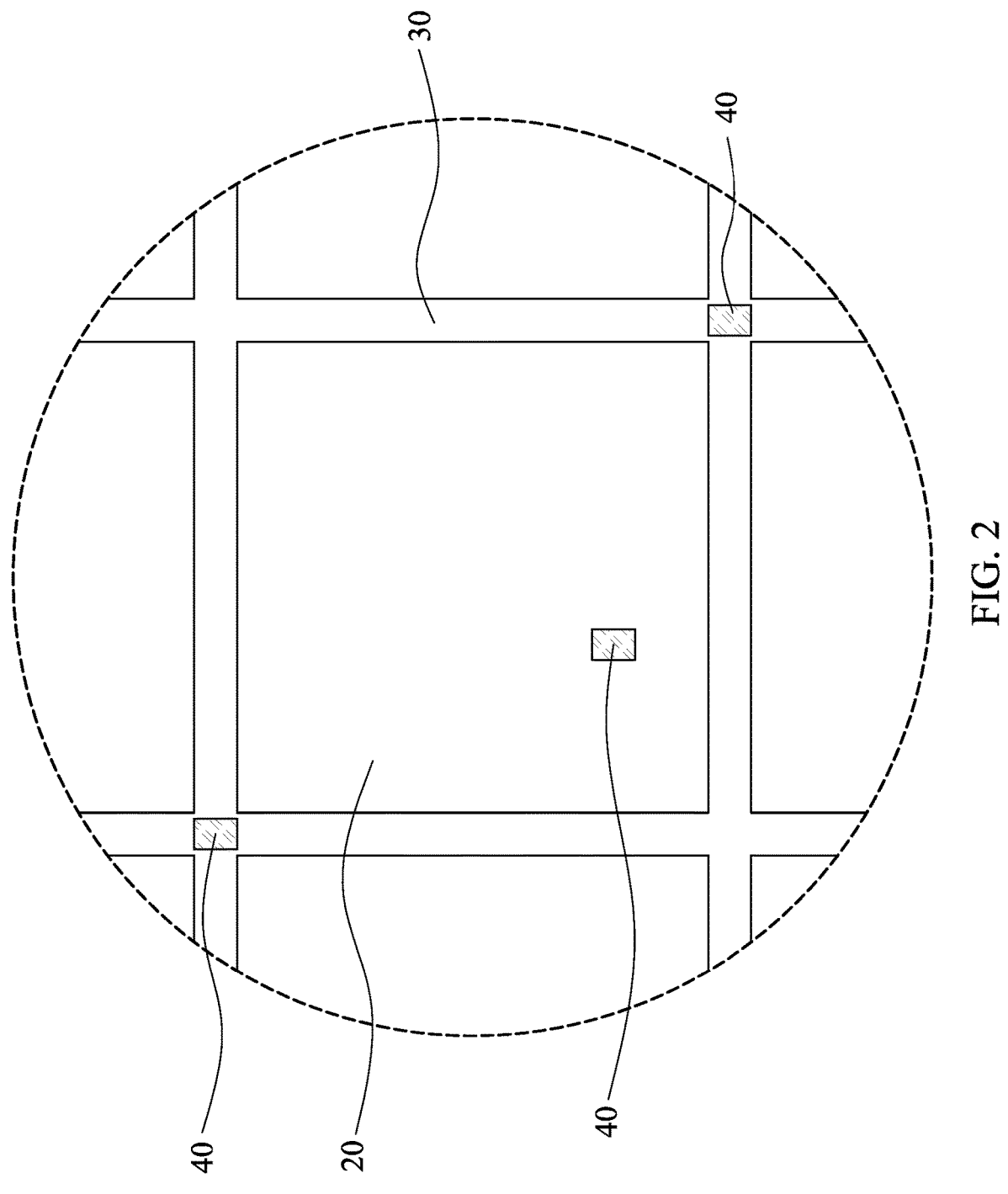
FIG. 2 is an enlarged view of region R of the semiconductor device as shown in FIG. 1, in accordance with some embodiments of the present disclosure.

FIG. 1 is a top view of a wafer 10 according to various aspects of the present disclosure, and FIG. 2 is a top view of the enlargement of a dotted region R in FIG. 1.

As shown in FIG. 1 and FIG. 2, the wafer 10 may be sawed along scribe lines 30 into a plurality of dies 20. Each of the dies 20 may include semiconductor devices, such as a memory die (e.g., dynamic random access memory (DRAM) die, a static random access memory (SRAM) die, etc.), a power management die (e.g., power management integrated circuit (PMIC) die), a logic die (e.g., system-on-a-chip (SoC), central processing unit (CPU), graphics processing unit (GPU), application processor (AP), microcontroller, etc.), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components.

As shown in FIG. 2, the semiconductor testing structures 40 may be disposed on the wafer 10. In some embodiments, the semiconductor testing structures 40 may be located on the scribe lines 30. In some embodiments, the semiconductor testing structures 40 may be disposed at the corner of an edge of each of the dies 20. In some embodiments, the semiconductor testing structures 40 may be located inside the die 20. In some embodiments, the semiconductor testing structure 40 can be utilized to detect vertical electrical leakage of a semiconductor device included in the die 20. For example, the semiconductor testing structure 40 may be utilized to determine whether a semiconductor device presents a risk of electrical leakage between a bit line and the zero metal (M0) layer, or between the M0 layer and the first metal (M1) layer, or between the M1 layer and the second metal (M2) layer, and so on.

More specifically, the semiconductor device, such as a memory device, may include a structure, which is the same as or similar to the semiconductor testing structure 40. The structure of the semiconductor device and the semiconductor testing structure 40 may be formed under the same process. Thus, the test results, such as electrical properties, scanning electron microscope (SEM) image, transmission electron microscope (TEM) image and/or overlay error, of the semiconductor testing structure 40 may be utilized to monitor the semiconductor device.

Figure 3:
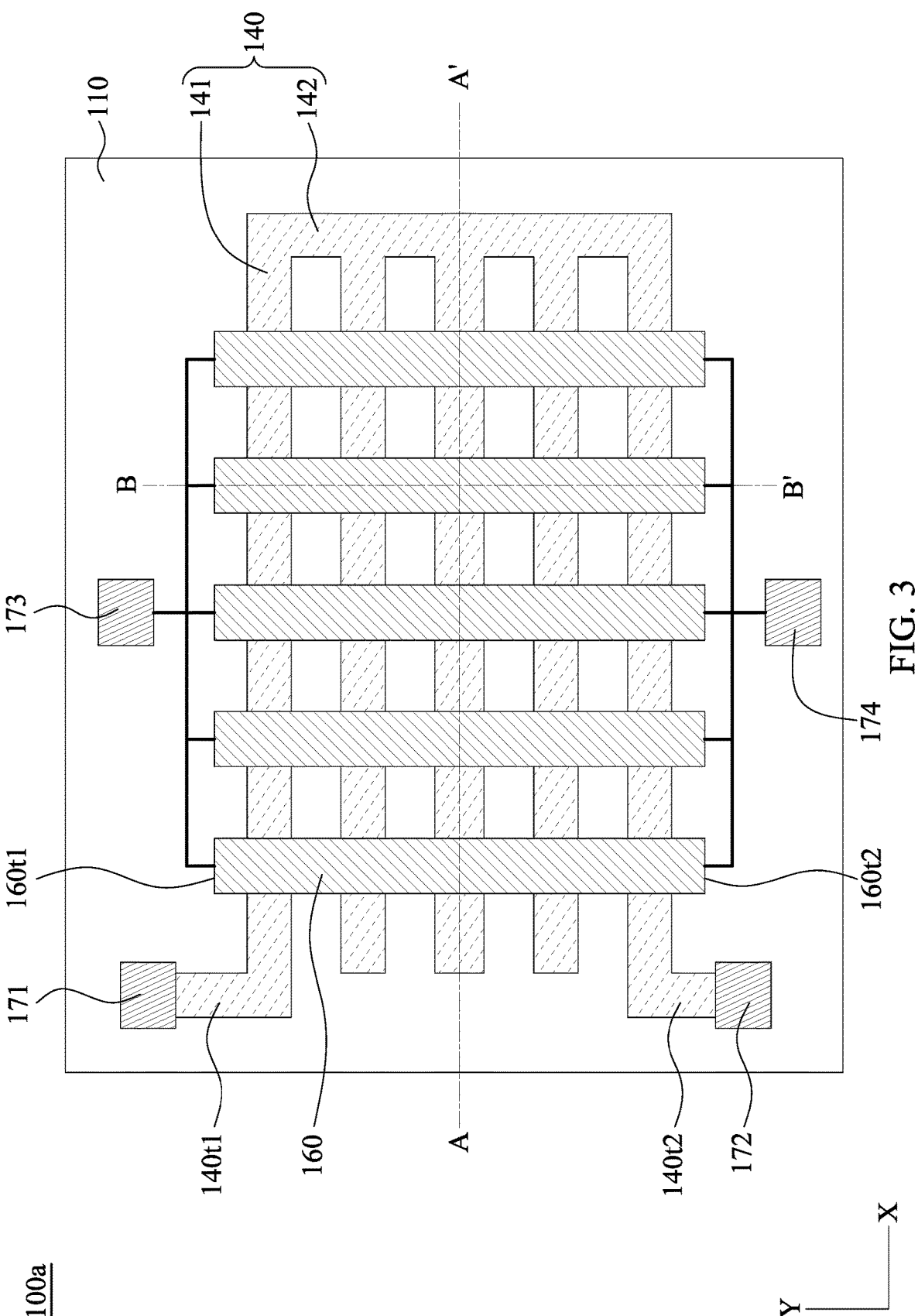
FIG. 3 is a top view of a semiconductor testing structure, in accordance with some embodiments of the present disclosure.
Figure 4A:
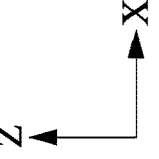
FIG. 4A is a cross-sectional view along line A-A' of the semiconductor testing structure as shown in FIG. 3, in accordance with some embodiments of the present disclosure.

FIG. 3A is a top view of a semiconductor testing structure 100a, FIG. 4A is a cross-section along line A-A', and FIG. 4B is a cross-section along line B-B' of the semiconductor testing structure 100a as shown in FIG. 3, in accordance with some embodiments of the present disclosure. It should be noted that some elements or features are omitted from FIG. 3 for brevity.

In some embodiments, the semiconductor testing structure 100a may include a substrate 110, a gate dielectric 120, a gate electrode 130, a metal layer 140, a dielectric structure 150, and a metal layer 160.

The semiconductor testing structure 100a can include a substrate 110. The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 110 may have a multilayered structure, or the substrate 110 may include a multilayered compound semiconductor testing structure.

The gate dielectric 120 may be disposed on the substrate 110. In some embodiments, the gate dielectric 120 can include silicon oxide ($SiO_x$), silicon nitride ($Si_xN_y$), silicon oxynitride (SiON), or a combination thereof. In some embodiments, the gate dielectric 120 can include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of the disclosure.

The gate electrode 130 may be disposed on the gate dielectric 120. In some embodiments, the gate electrode 130 can include a polysilicon layer. In some embodiments, the gate electrode 130 can be made of conductive material, such as aluminum (Al), copper (Cu), tungsten (W), titanium (Ti), tantalum (Ta), or other applicable materials. In some embodiments, the gate electrode 130 can include a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The metal layer 140 may be disposed on the gate electrode 130. The metal layer 140 may be electrically connected to the gate electrode 130. In some embodiments, the metal layer 140 may have a multilayered structure. In some embodiments, the metal layer 140 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or a combination thereof.

In some embodiments, as shown in FIG. 3, the metal layer 140 may include a plurality of fingers 141 and a connecting portion 142. In some embodiments, the metal layer 140 may be located at the same horizontal level as a bit line, which may be included in a semiconductor device or a die.

In some embodiments, the plurality of fingers 141 of the metal layer 140 may be spaced apart from each other. In some embodiments, the fingers 141 of the metal layer 140 may extend along an X-axis.

In some embodiments, the connecting portion 142 of the metal layer 140 may connect the plurality of fingers 141. In some embodiments, the connecting portion 142 of the metal layer 140 may extend along a Y-axis.

In some embodiments, the metal layer 140 may have a terminal 140t1 electrically connected to a conductive pad 171. In some embodiments, the metal layer 140 may have a terminal 140t2 electrically connected to a conductive pad 172.

In some embodiments, the dielectric structure 150 may be disposed on the metal layer 140. In some embodiments, the metal layer 140 may be spaced apart from the metal layer 160 by the dielectric structure 150. In some embodiments, the dielectric structure 150 may include a dielectric layer 151 and a dielectric layer 152 disposed on the dielectric layer 151.

In some embodiments, each of the dielectric layers 151 and 152 may include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. Examples of the high-k material include a dielectric material having a dielectric constant that is higher than that of silicon dioxide ($SiO_2$), or a dielectric material having a dielectric constant exceeding about 3.9. In some embodiments, the material of the dielectric layer 151 may be different from that of the dielectric layer 152. For example, the dielectric layer 151 may be silicon nitride ($Si_3N_4$), and the dielectric layer 152 may be silicon dioxide ($SiO_2$).

In some embodiments, as shown in FIG. 3, FIG. 4A and FIG. 4B, each of the gate dielectric 120, the gate electrode 130, the metal layer 140, and the dielectric layer 151 may extend along an X-axis. In some embodiments, each of the fingers 141 may be separated by the dielectric layer 152 as shown in FIG. 4B. In some embodiments, the dielectric layer 152 may cover or contact a sidewall of the dielectric layer 151. In some embodiments, the dielectric layer 152 may cover or contact a sidewall of the fingers 141 of the metal layer 140. In some embodiments, the dielectric layer 152 may cover or contact a sidewall of the gate electrode 130. In some embodiments, the dielectric layer 152 may cover or contact a sidewall of the gate dielectric 120. In some embodiments, as shown in FIG. 4B, the dielectric layer 152 may extend to the substrate 110.

In some embodiments, the metal layer 160 may be disposed on the dielectric structure 150. In some embodiments, the metal layer 160 may be disposed on the dielectric layer 152 of the dielectric structure 150. In some embodiments, the metal layer 160 may be located at a horizontal level above that of the metal layer 140. In some embodiments, the metal layer 160 may be electrically isolated from the metal layer 140. In some embodiments, the metal layer 160 may be located at the same horizontal level as the M0 layer, which is included in a semiconductor device or a die.

In some embodiments, as shown in FIG. 3, the metal layer 160 may extend along a Y-axis. In some embodiments, the metal layer 160 may have a terminal 160t1 electrically connected to a conductive pad 173. In some embodiments, each of the plurality of the metal layers 160 may have the terminal 160t1 electrically connected to the conductive pad 173. In some embodiments, the metal layer 160 may have a terminal 160t2 electrically connected to a conductive pad 174. In some embodiments, each of the plurality of the metal layers 160 may have the terminal 160t2 electrically connected to the conductive pad 174. In some embodiments, the metal layer 160 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or combinations thereof.

In some embodiments, the semiconductor testing structure 100a may be utilized to detect vertical electrical leakage. In some embodiments, the semiconductor testing structure 100a may be utilized to detect electrical leakage between two metal layers located at different horizontal levels. For example, the semiconductor testing structure 100a may be utilized to detect electrical leakage between the metal layers 140 and 160.

In some embodiments, a first electrical potential can be applied to the conductive pads 171 and 172, and a second electrical potential can be applied to the conductive pads 173 and 174. In some embodiments, an electrical leakage can be detected through the measurement of the current flowing between the conductive pads 171/172 and the conductive pads 173/174. In another embodiments, a conductive path between the conductive pads 171/172 and the conductive pads 173/174 can be detected through the measurement of a resistance. When the metal layer 140 is isolated from the metal layer 160, current can be barely measured between the conductive pads 171/172 and the conductive pads 173/174. When electrical leakage occurs between the metal layers 140 and 160, a leakage current can be measured between the conductive pads 171/172 and the conductive pads 173/174. When the metal layer 140 is isolated from the metal layer 160, a first resistance may be obtained. When a conductive path exists between the metal layers 140 and 160, a second resistance, different from the first resistance, may be obtained. Based on a measured current, it can be determined whether electrical leakage occurs between the metal layers 140 and 160. Based on a measured resistance, it can be determined whether a conductive path exists between the metal layers 140 and 160.

In some embodiments, the pattern of the metal layer 160 may be formed by an etching process, such as dry etching. In an ideal condition, when the metal layer 160 is patterned, the dielectric structure 150 is intact or slightly etched after etching, as shown in FIG. 4A and FIG. 4B. Since the dielectric structure 150 may separate the metal layer 140 from the metal layer 160, no electrical leakage occurs between the metal layers 140 and 160 in the semiconductor testing structure 100a. Electrical testing of the semiconductor testing structure 100a, shows no leakage between, for example, the bit line and the M0 layer of the device. As a result, the process need not be tuned or adjusted.

Figure 5:
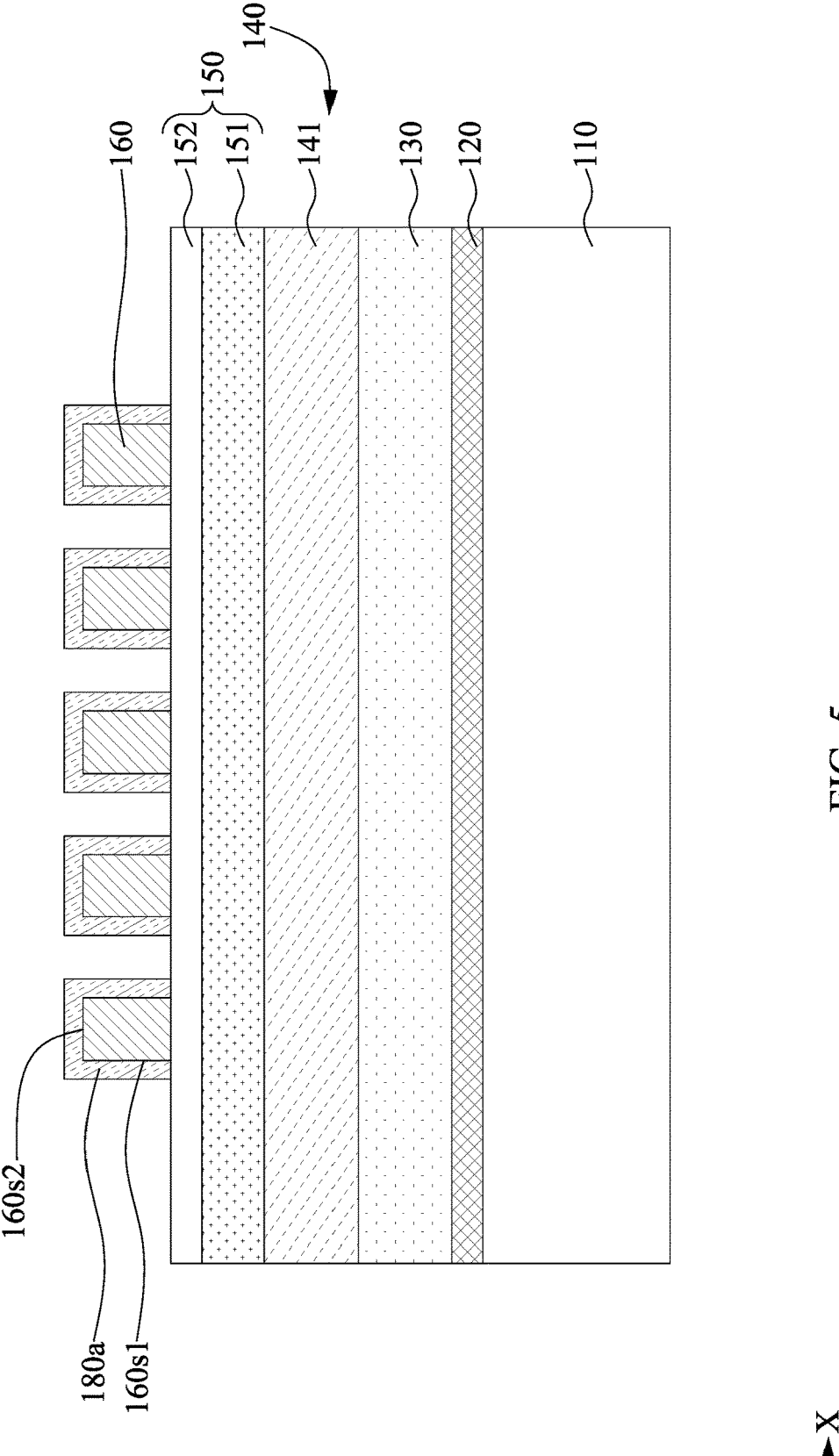
FIG. 5 is a cross-sectional view of a semiconductor testing structure, in accordance with some embodiments of the present disclosure.

FIG. 5 is a cross-section of a semiconductor testing structure 100b, in accordance with some embodiments of the present disclosure. The semiconductor testing structure 100b is similar to the semiconductor testing structure 100a as shown in FIG. 4A, with differences there between as follows.

In some embodiments, the semiconductor testing structure 100a further includes a conductive layer 180a. In some embodiments, the conductive layer 180a may be disposed on a surface 160s1 of the metal layer 160. In some embodiments, the conductive layer 180a may cover the surface 160s1 of the metal layer 160. In some embodiments, the conductive layer 180a may be disposed on a surface 160s2 (or an upper surface) of the metal layer 160. In some embodiments, the conductive layer 180a may cover the surface 160s2 of the metal layer 160.

In some embodiments, the conductive layer 180a is formed by corrosion of the metal layer 160. In some embodiments, the conductive layer 180a may include metal, metal oxide, other metal derivatives or impurities. In some embodiments, the conductive layer 180a is formed by oxidation of the metal layer 160. In some embodiments, the conductive layer 180a may be regarded as a portion of the metal layer 160.

As time passes, the conductive layer 180a may be enlarged because of corrosion of the metal layer 160. When the conductive layer 180a is in contact with an electrically conductive material, electrical leakage occurs. As shown in FIG. 5, the dielectric structure 150 of the semiconductor testing structure 100a remains intact or is slightly etched. The conductive layer 180a may be spaced apart from the metal layer 140, and no leakage occurs between the metal layer 140 and the conductive layer 180a.

Figure 6:
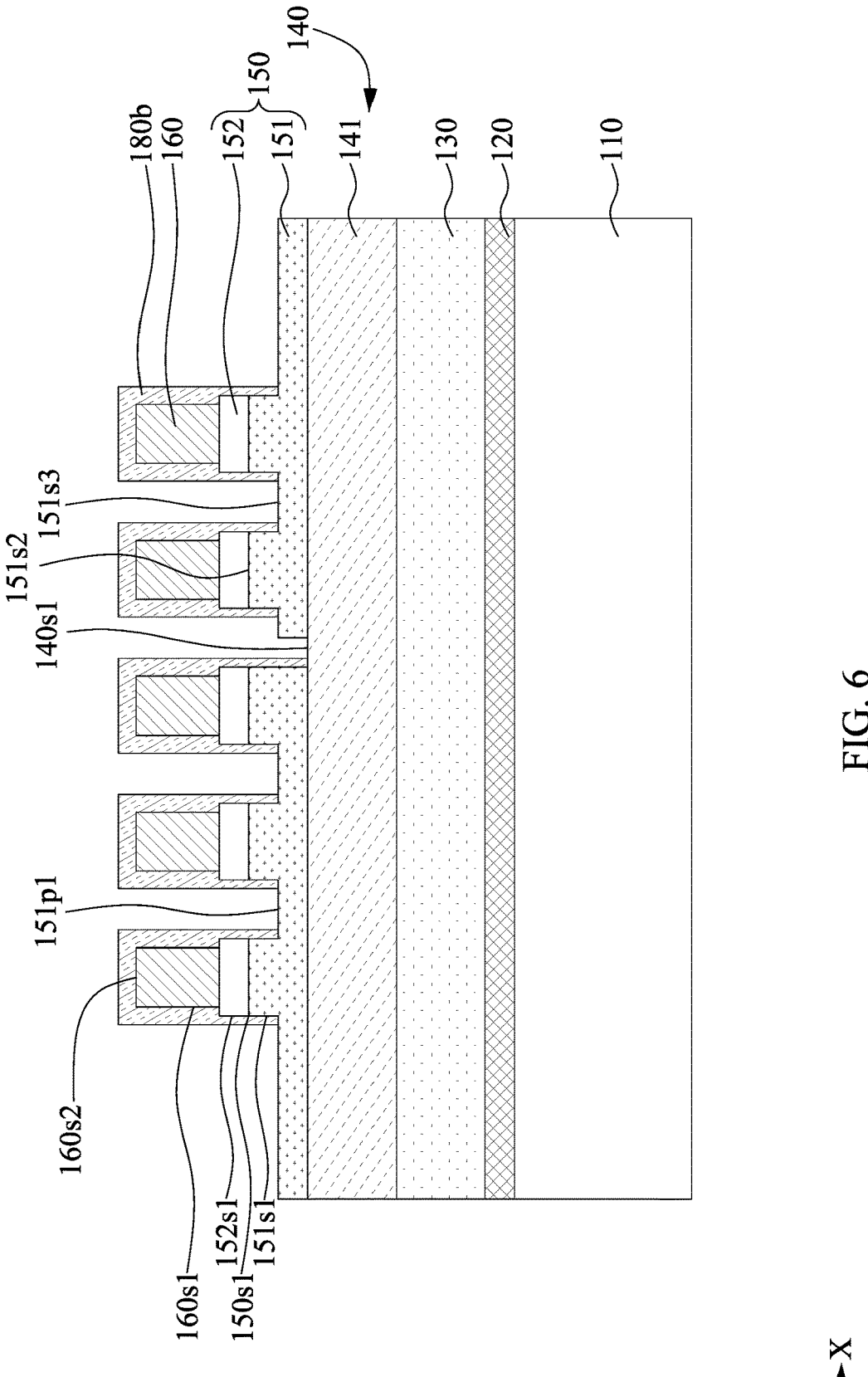
FIG. 6 is a cross-sectional view of a semiconductor testing structure, in accordance with some embodiments of the present disclosure.

FIG. 6 is a cross-section of a semiconductor testing structure 100c, in accordance with some embodiments of the present disclosure. The semiconductor testing structure 100c is similar to the semiconductor testing structure 100a as shown in FIG. 4A, with differences there between as follows.

In some embodiments, the dielectric structure 150 may be etched. In some embodiments, the conductive layer 180b may be disposed on a sidewall 150s1 of the dielectric structure 150. The sidewall 150s1 of the dielectric structure 150 may extend between the metal layers 140 and 160. In some embodiments, the surface 160s1 of the metal layer 160 may not be coplanar with the sidewall 150s1 of the dielectric structure 150.

In some embodiments, the dielectric layer 152 may be etched. In some embodiments, the conductive layer 180b may cover a surface 152s1 (or a lateral surface) of the dielectric layer 152. In some embodiments, the conductive layer 180b may contact the surface 152s1 of the dielectric layer 152. In some embodiments, the surface 160s1 of the metal layer 160 may not be coplanar with the surface 152s1 of the dielectric layer 152.

In some embodiments, the dielectric layer 151 may be etched. In some embodiments, the conductive layer 180b may cover a surface 151s1 (or a lateral surface) of the dielectric layer 151. In some embodiments, the dielectric layer 151 may have a surface 151s2 (or the first upper surface) and a surface 151s3 (or the second upper surface) lower than the surface 151s2. The surface 151s2 of the dielectric layer 151 may be in contact with the dielectric layer 152. The surface 151s3 may extend between two metal layers 160. In some embodiments, a portion 151p of the surface 151s3 of the dielectric layer 151 may be exposed from the conductive layer 180b. In some embodiments, the surface 160s1 of the metal layer 160 may not be coplanar with the surface 151s1 of the dielectric layer 151.

In some cases, the dielectric structure 150 may be over-etched, resulting in a surface 140s1 (or an upper surface) of the metal layer 140 being exposed. As time passes, the conductive layer 180b may extend to the surface 140s1, thereby causing vertical electrical leakage between the metal layers 140 and 160. In this condition, vertical electrical leakage may also occur between a bit line and the M0 layer of a semiconductor device or a die. In response to the vertical electrical leakage of the semiconductor testing structure 100c, the process condition may be correspondingly tuned or adjusted, thereby optimizing the manufacture.

Further, in this embodiment, the metal layer 140 has a plurality of fingers 141, which can enhance the sensitivity of detecting vertical electrical leakage between the metal layers 140 and 160.

Figure 7:
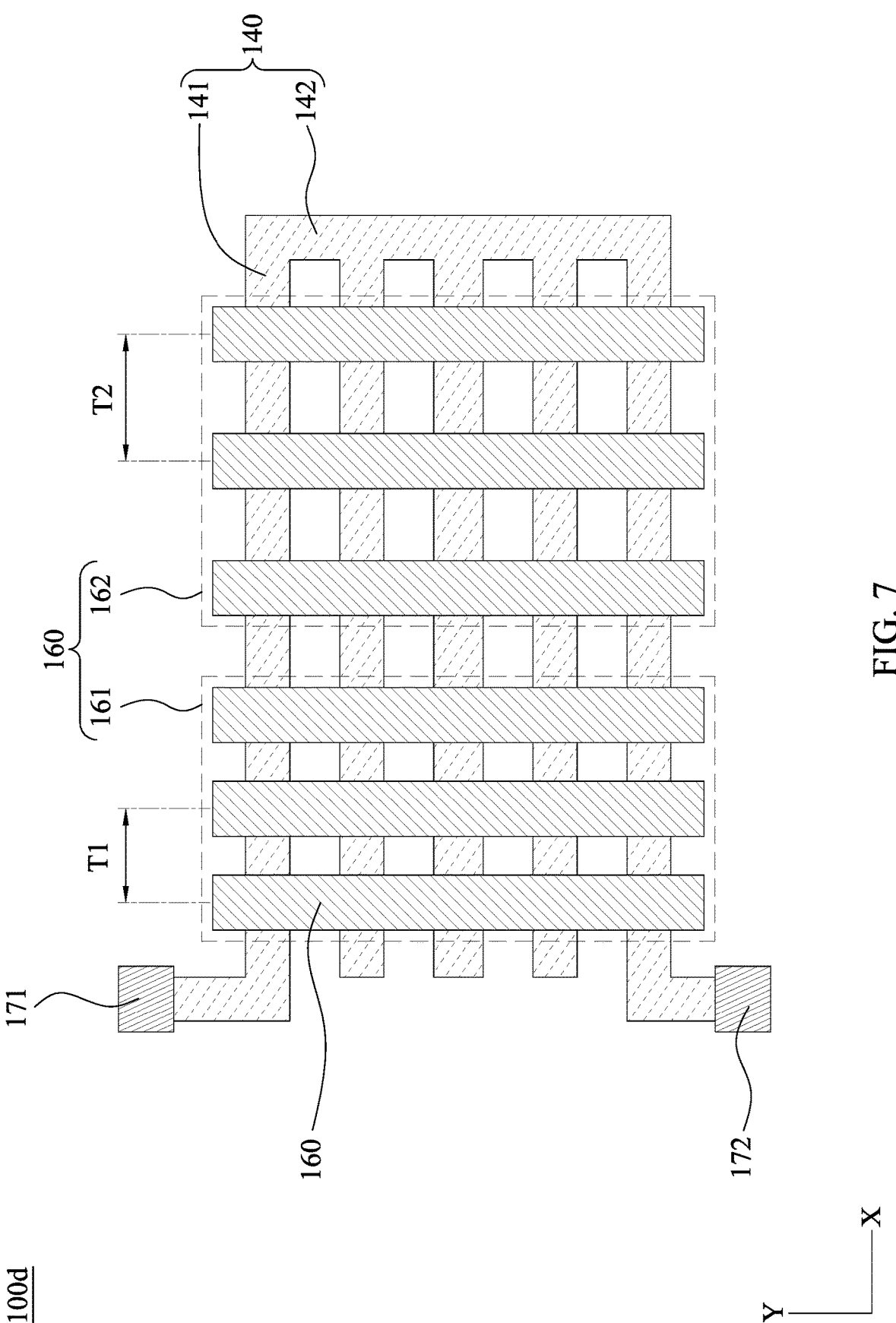
FIG. 7 is a top view of a semiconductor testing structure, in accordance with some embodiments of the present disclosure.

FIG. 7 is a top view of a semiconductor testing structure 100d, in accordance with some embodiments of the present disclosure. The semiconductor testing structure 100d is similar to the semiconductor testing structure 100a as shown in FIG. 3, with differences there between as follows.

In some embodiments, the metal layer 160 may have a portion 161 and a portion 162. The portion 161 of the metal layer 160 may have a pitch T1. The portion 162 of the metal layer 160 may have a pitch T2. In some embodiments, the pitch T1 may be different from T2.

In some cases, density of the traces (e.g., bit lines, the M0 layer, and the M1 layer) may vary in different regions of a semiconductor device. For example, the density of the trace in an array region may be different from that in a peripheral region. When etching is performed to pattern a metallization layer, the dielectric structure beneath the metallization layer may be etched to different degrees in an array region and in a peripheral region because of loading effect. The portions 161 and 162 of the metal layer 160 may be utilized to detect electrical leakage in the array region and in the peripheral region, thereby improving the sensitivity of the semiconductor testing structure 100d.

FIG. 8 is a flowchart illustrating a method 200 of manufacturing a semiconductor testing structure, in accordance with some embodiments of the present disclosure.

The method 200 begins with operation 202 in which a substrate may be provided. In some embodiments, a gate dielectric, a gate electrode, and a first metallization layer may be formed on the substrate in order.

The method 200 continues with operation 204 in which a first dielectric layer may be formed on the first metallization layer.

The method 200 continues with operation 206 in which a first etching process may be performed. In some embodiments, the first dielectric layer may be patterned. In some embodiments, the first metallization layer may be patterned, thereby forming a first metal layer including a plurality of fingers. In some embodiments, the gate electrode may be patterned. In some embodiments, the gate dielectric may be patterned. In some embodiments, the first dielectric layer may extend along the X-direction. In some embodiments, each of the fingers may extend along the X-direction. In some embodiments, the gate electrode may extend along the X-direction. In some embodiments, the gate dielectric may extend along the X-direction.

The method 200 continues with operation 208 in which a second dielectric layer may be formed, thereby forming a dielectric structure. In some embodiments, the second dielectric layer may be formed on the first dielectric layer. In some embodiments, the second dielectric layer may separate the fingers of the first metal layer from each other. In some embodiments, the second dielectric layer may cover an upper surface of the first dielectric layer. In some embodiments, the second dielectric layer may cover a lateral surface of the first dielectric layer. In some embodiments, the second dielectric layer may cover a lateral surface of the first metal layer. In some embodiments, the second dielectric layer may cover a lateral surface of the gate electrode.

The method 200 continues with operation 210 in which a second metallization layer may be formed on the dielectric structure.

The method 200 continues with operation 212 in which a second etching process may be performed, thereby forming a semiconductor testing structure. In some embodiments, a plurality of second metal layers may be formed. In some embodiments, the second metal layer may extend along the Y-direction.

The method 200 is merely an example, and is not intended to limit the present disclosure beyond what is explicitly recited in the claims. Additional operations can be provided before, during, or after each operations of the method 200, and some operations described can be replaced, eliminated, or reordered for additional embodiments of the method. In some embodiments, the method 200 can include further operations not depicted in FIG. 8. In some embodiments, the method 200 can include one or more operations depicted in FIG. 8.

FIG. 9A, FIG. 9B, FIG. 10A, FIG. 10B, FIG. 11A, FIG. 11B, FIG. 12A, FIG. 12B, FIG. 13A, FIG. 13B, FIG. 14A, and FIG. 14B, illustrate one or more stages of an exemplary method of manufacturing a semiconductor testing structure according to some embodiments of the present disclosure. FIG. 9A to FIG. 14A and FIG. 9B to FIG. 14B are cross-sections of different planes. For example, FIG. 9A to FIG. 14A are cross-sections of the XZ plane, and FIG. 9B to FIG. 14B are cross-sections of the YZ plane. In some embodiments, the semiconductor testing structure 100a may be manufactured through the operations described with respect to FIG. 9A, FIG. 9B, FIG. 10A, FIG. 10B, FIG. 11A, FIG. 11B, FIG. 12A, FIG. 12B, FIG. 13A, FIG. 13B, FIG. 14A, and FIG. 14B.

Referring to FIG. 9A and FIG. 9B, a substrate 110 may be provided. In some embodiments, a gate dielectric 120, a gate electrode 130, and a metallization layer 140' may be formed on the substrate 110 in order. In some embodiments, each of the gate dielectric 120, the gate electrode 130, and the metallization layer 140' may be formed by chemical vapor deposition (CVD), atomic layer deposition (ALD), physical vapor deposition (PVD), low-pressure chemical vapor deposition (LPCVD), plasma-enhanced CVD (PECVD), or other suitable processes.

Referring to FIG. 10A and FIG. 10B, a dielectric layer 151 may be formed on the metallization layer 140'. In some embodiments, the dielectric layer 151 may be formed by deposition processes, such as PVD, CVD, ALD, LPCVD, or other suitable processes.

Figure 11B:
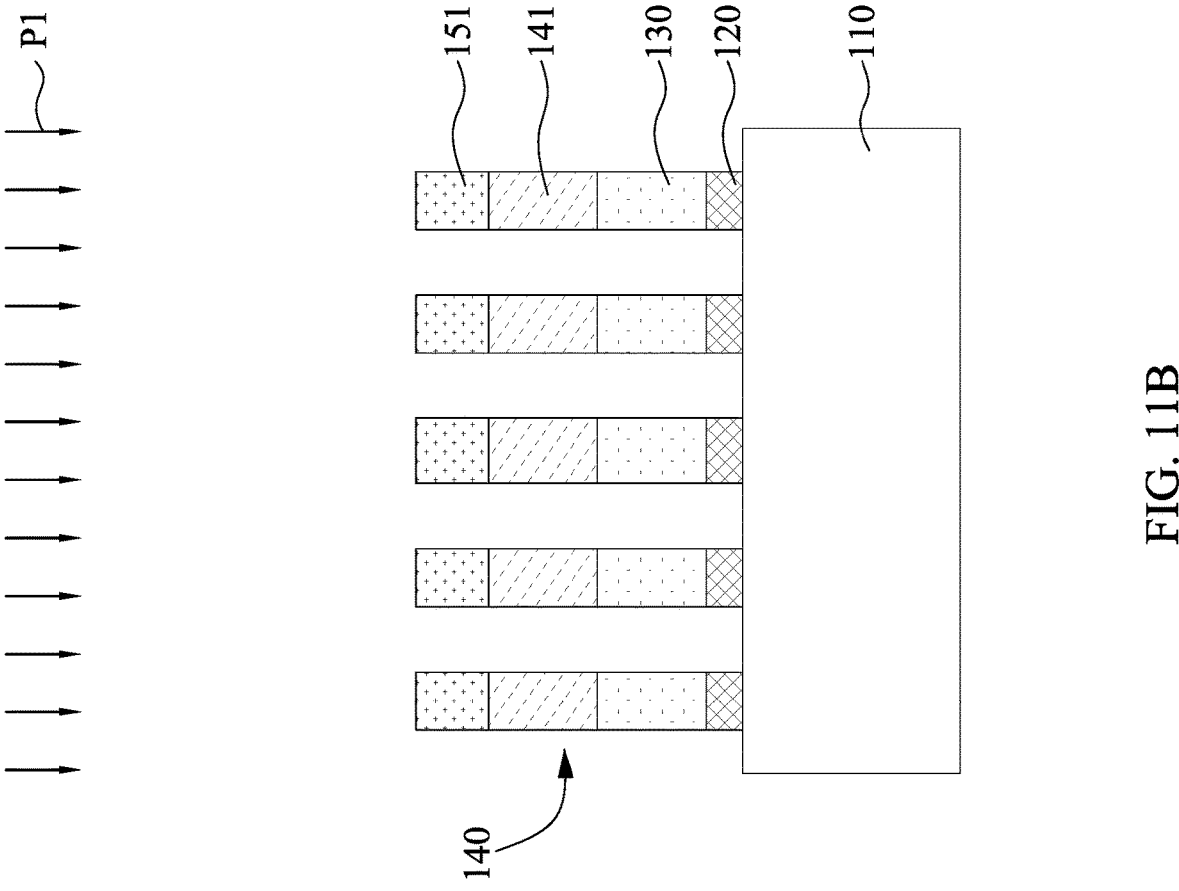

Referring to FIG. 11A and FIG. 11B, an etching process P1 may be performed. In some embodiments, the dielectric layer 151 may be patterned. In some embodiments, the metallization layer 140' may be patterned, thereby forming a metal layer 140 including a plurality of fingers 141. In some embodiments, the gate electrode 130 may be patterned. In some embodiments, the gate dielectric 120 may be patterned. In some embodiments, the dielectric layer 151 may extend along the X-direction. In some embodiments, each of the fingers 141 of the metal layer 140 may extend along the X-direction. In some embodiments, the fingers 141 may be connected by a connecting portion 142 (not shown). In some embodiments, the gate electrode 130 may extend along the X-direction. In some embodiments, the gate dielectric 120 may extend along the X-direction.

Referring to FIG. 12A and FIG. 12B, a dielectric layer 152 may be formed, thereby forming a dielectric structure 150. In some embodiments, the dielectric layer 152 may be formed on the dielectric layer 151. In some embodiments, the dielectric layer 152 may separate the fingers 141 of the metal layer 140.

In some embodiments, the dielectric layer 152 may cover an upper surface of the dielectric layer 151. In some embodiments, the dielectric layer 152 may cover a lateral surface of the dielectric layer 151. In some embodiments, the dielectric layer 152 may cover a lateral surface of the metal layer 140. In some embodiments, the dielectric layer 152 may cover a lateral surface of the gate electrode 130. In some embodiments, the dielectric layer 152 may be formed by deposition processes, such as CVD, PVD, ALD, LPCVD, or other suitable processes, and a chemical mechanical polishing (CMP) process may be performed to planarize an upper surface of the dielectric layer 152.

Referring to FIG. 13A and FIG. 13B, a metallization layer 160' may be formed on the dielectric structure 150. In some embodiments, the metal layer 160 may be formed by deposition processes, such as PVD, CVD, ALD, LPCVD, or other suitable process.

Figure 14A:
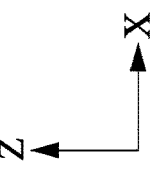

Referring to FIG. 14A and FIG. 14B, an etching process P2 may be performed, thereby forming a semiconductor testing structure as shown in FIG. 4A and FIG. 4B. In some embodiments, the metallization layer 160' may be patterned, thereby forming a metal layer 160. In some embodiments, each of the metal layers 160 may extend along the Y-direction.

Figure 15:
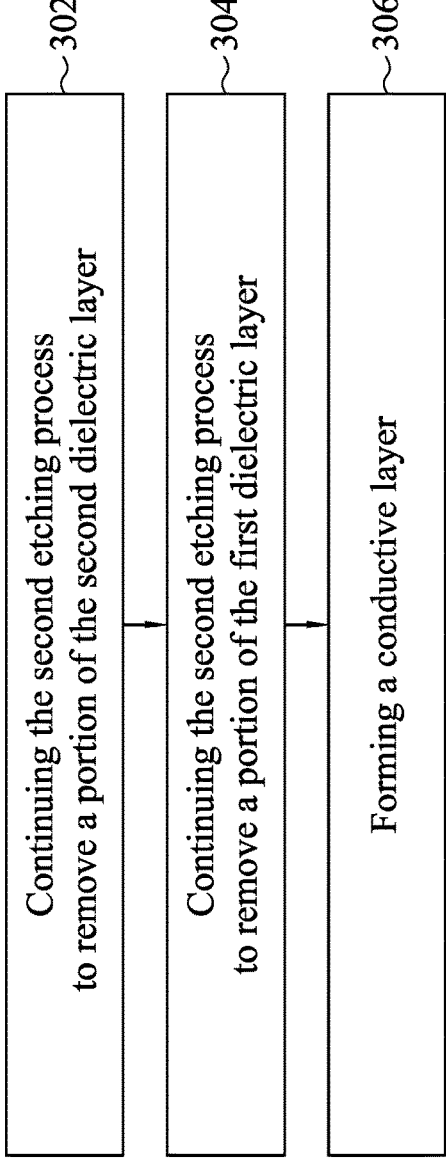
FIG. 15 is a flowchart illustrating a method of manufacturing a semiconductor testing structure, in accordance with some embodiments of the present disclosure.

FIG. 15 is a flowchart illustrating a method 300 of manufacturing a semiconductor testing structure, in accordance with some embodiments of the present disclosure.

The method 300 begins with operation 302, which may be subsequent to operation 212. In some embodiments, the second etching process may be continued to remove a portion of the second dielectric layer. In some embodiments, the patterned second dielectric layer may extend along the Y-direction. In some embodiments, a lateral surface of the second dielectric layer may be exposed.

The method 300 continues with operation 304 in which the second etching process may be continued to remove a portion of the first dielectric layer. In some embodiments, a lateral surface of the first dielectric layer may be exposed. In some embodiments, the first dielectric layer may have a first upper surface in contact with the second dielectric layer and a second upper surface lower than the first upper surface. In some embodiments, the second upper surface of the first dielectric layer may be exposed from the second metal layer. In some embodiments, a portion of an upper surface of the first metal layer may be exposed.

The method 300 continues with operation 306 in which a conductive layer may be formed, thereby forming a semiconductor device. In some embodiments, the conductive layer may be formed on an external surface of the second metal layer. In some embodiments, the conductive layer may be formed on a lateral surface of the second metal layer. In some embodiments, the conductive layer may be formed on an upper surface of the second metal layer. In some embodiments, the conductive layer may be formed on the lateral surface of the second dielectric layer. In some embodiments, the conductive layer may be formed on the lateral surface of the first dielectric layer. In some embodiments, the conductive layer may be formed on the upper surface of the first metal layer.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 15. In some embodiments, the method 300 can include one or more operations depicted in FIG. 15.

FIG. 16A, FIG. 16B, FIG. 17A, FIG. 17B, FIG. 18A and FIG. 18B illustrate one or more stages of an exemplary method of manufacturing a semiconductor testing structure according to some embodiments of the present disclosure. FIG. 16A to FIG. 18A are cross-sections of the XZ plane, and FIG. 16B to FIG. 18B are cross-sections of the YZ plane. In some embodiments, the semiconductor testing structure 100c may be manufactured through the operations described with respect to FIG. 16A, FIG. 16B, FIG. 17A, FIG. 17B, FIG. 18A and FIG. 18B.

Figure 16A:
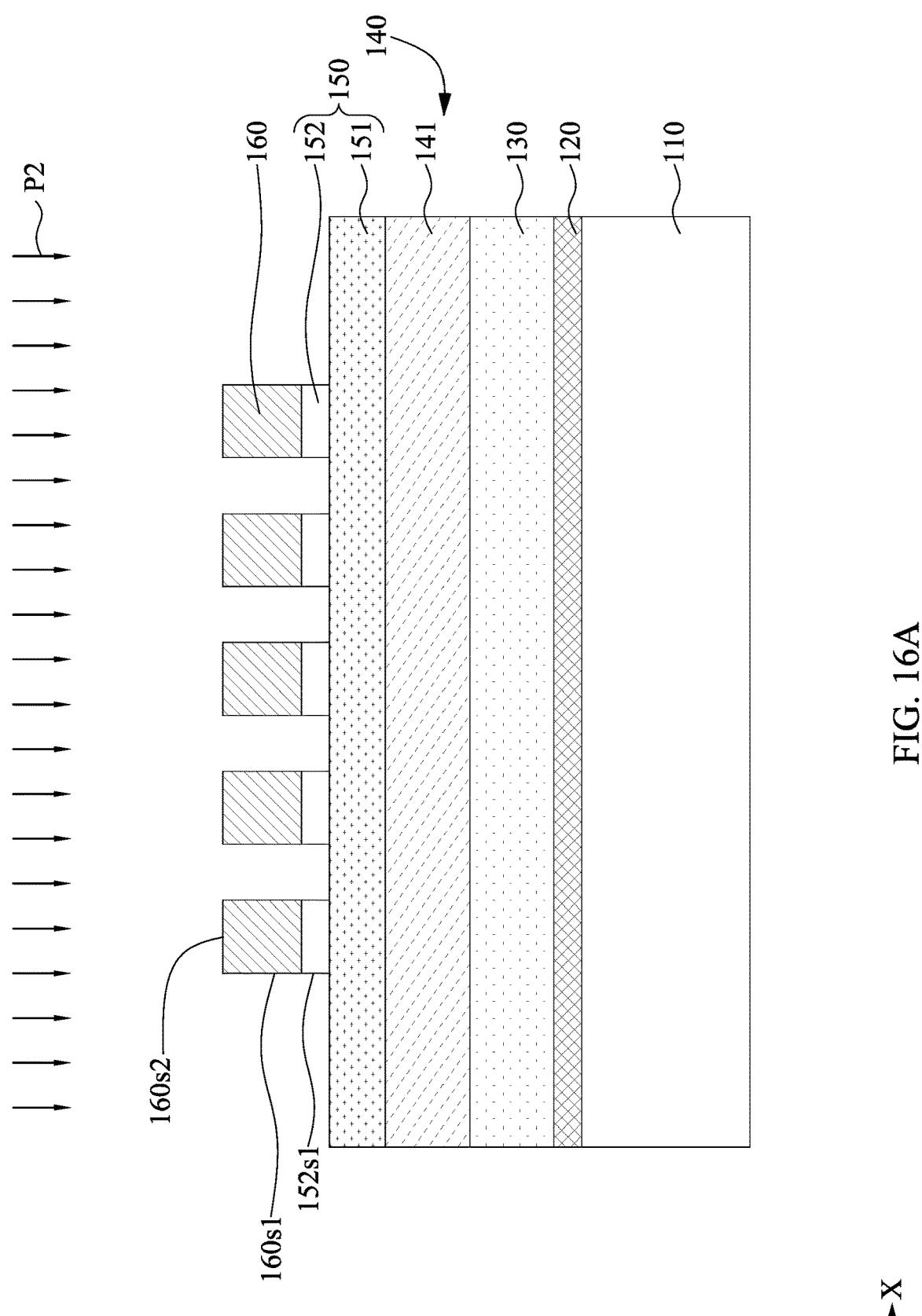
FIG. 16A and FIG. 16B illustrate one or more stages of an exemplary method of manufacturing a semiconductor testing structure according to some embodiments of the present disclosure.
Figure 16B:
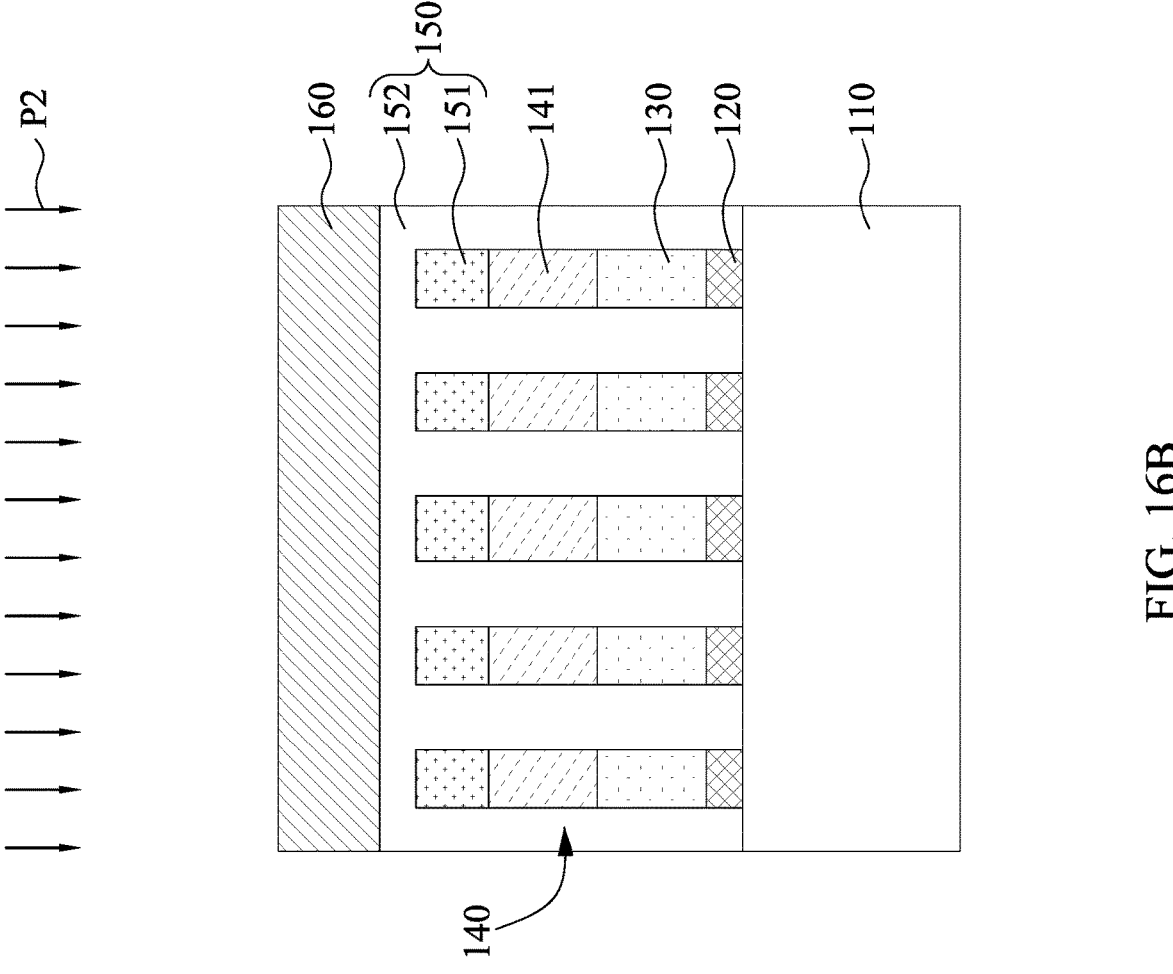

Referring to FIG. 16A and FIG. 16B, the operation thereof may be performed subsequently to the operation of FIG. 14A and FIG. 14B. In some embodiments, the etching process P2 may be continued to remove a portion of the dielectric layer 152. In some embodiments, a surface 152s1 of the dielectric layer 152 may be exposed.

Figure 17A:
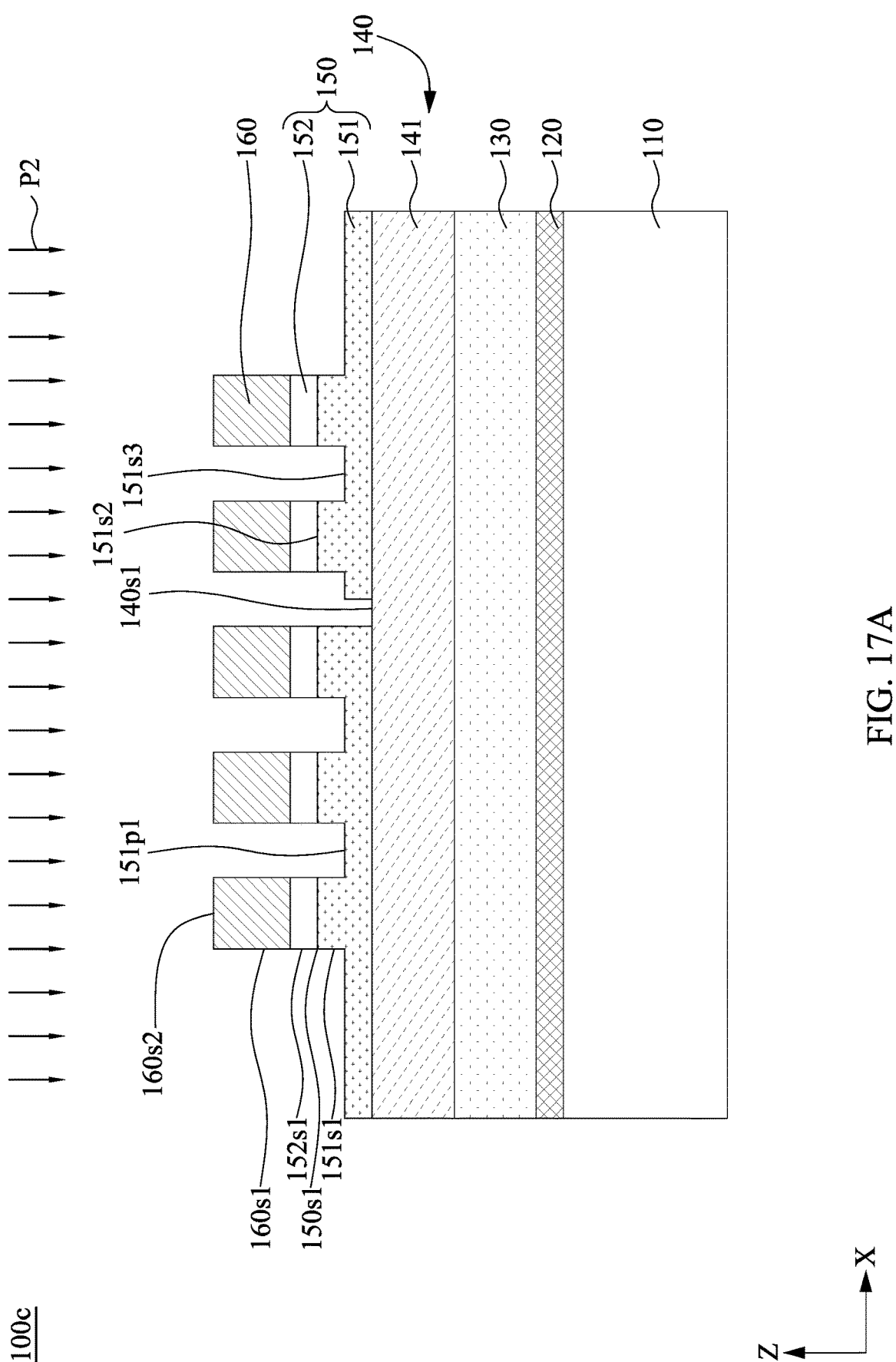
Figure 18A:
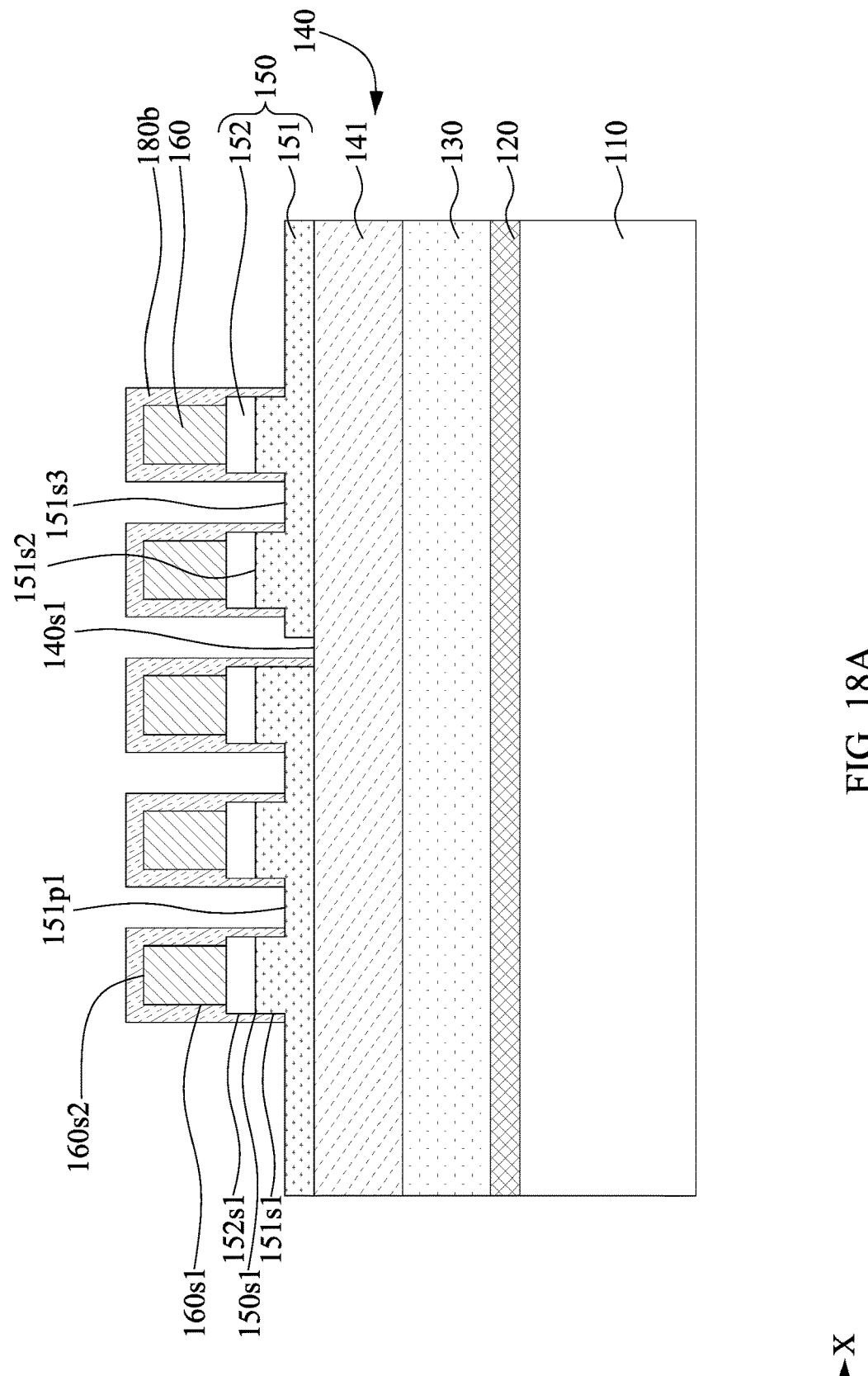

Referring to FIG. 17A and FIG. 17B, the etching process P2 may be continued to remove a portion of the dielectric layer 151. In some embodiments, a surface 151s1 of the dielectric layer 151 may be exposed. In some embodiments, the dielectric layer 151 may have a surface 152s2 in contact with the dielectric layer 152 and a surface 152s3 lower than the surface 152s2. In some embodiments, a portion of a surface 140s1 of the metal layer 140 may be exposed.

Referring to 18A and 18B, a conductive layer 180b may be formed. In some embodiments, the conductive layer 180b may be formed on an external surface of the metal layer 160. In some embodiments, the conductive layer 180b may be formed on a surface 160s1 of the metal layer 160. In some embodiments, the conductive layer 180b may be formed on a surface 160s2 of the metal layer 160. In some embodiments, the conductive layer 180b may be formed on the surface 152s1 of the dielectric layer 152. In some embodiments, the conductive layer 180b may be formed on the surface 151s1 of the dielectric layer 151. In some embodiments, the conductive layer 180b may be formed on the surface 140s1 of the metal layer 140.

In some embodiments, the semiconductor testing structures 100a and/or 100c may be utilized to detect vertical electrical leakage. For example, when the dielectric structure 150 is over-etched, electrical leakage may occur in the semiconductor testing structure 100c. In response to the electrical leakage of the semiconductor testing structure 100c, the process condition of the etching process P2 may be tuned or adjusted, thereby optimizing the process condition of a semiconductor manufacturing process.

One aspect of the present disclosure provides a semiconductor testing structure. The semiconductor testing structure includes a substrate, a first metal layer, a dielectric structure, and a second metal layer. The first metal layer is disposed on the substrate and includes a plurality of fingers extending along a first direction. The dielectric structure is disposed on the first metal layer. The second metal layer is disposed on the dielectric structure and electrically isolated from the first metal layer. The second metal layer extends along a second direction different from the first direction. The dielectric structure defines a sidewall extending between the first metal layer and the second metal layer.

Another aspect of the present disclosure provides another method of manufacturing a semiconductor testing structure. The semiconductor testing structure includes a substrate, a first metal layer, a dielectric structure, and a plurality of second metal layers. The first metal layer includes a plurality of fingers extending along a first direction. The dielectric structure is disposed on the first metal layer. Each of the plurality of second metal layers extends along a second direction different form the first direction.

Another aspect of the present disclosure provides a method of manufacturing a semiconductor testing structure. The method includes: providing a substrate; forming a first metal layer on the substrate, wherein the first metal layer comprises a plurality of fingers extending along a first direction; forming a dielectric structure on the first metal layer; and forming a plurality of second metal layers on the dielectric structure, wherein the first metal layer comprises a plurality of fingers extending along a first direction.

The embodiments of the present disclosure illustrate a semiconductor testing structure. The semiconductor testing structure may be utilized to detect electrical leakage between two metal layers located at different horizontal levels, such as electrical leakage between a bit line and the zero metal (M0) layer included in a semiconductor device or in a die. When vertical electrical leakage is detected from the semiconductor testing structure, the process condition may be correspondingly adjusted, thereby optimizing the process condition of a semiconductor manufacturing process.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor testing structure, comprising:
a substrate;
a first metal layer comprising a plurality of fingers extending along a first direction;
a dielectric structure disposed on the first metal layer; and
a plurality of second metal layers extending along a second direction different from the first direction; and
a plurality of conductive layers disposed on the dielectric structure;
wherein the second metal layers are disposed on and in contact with the dielectric structure and are enclosed by the conductive layers and the dielectric structure;
wherein each of the conductive layers disposed on a lateral surface and an upper surface of each of the plurality of second metal layers;
wherein the dielectric structure comprises a first dielectric layer and a second dielectric layer over the first dielectric layer, wherein the second metal layers are enclosed by the conductive layers and second dielectric layer of the dielectric structure;
wherein the first dielectric layer comprises a connecting portion connecting the plurality of fingers, wherein the connecting portion extends along the second direction and at a same horizontal level of the plurality of fingers in order to connect ends of the plurality of fingers.

2. The semiconductor testing structure of claim 1, wherein a first portion of the second metal layer has a first pitch, and a second portion of the second metal layer has a second pitch different from the first pitch.

3. The semiconductor testing structure of claim 1, wherein the plurality of second metal layers has a first terminal electrically connected to a first conductive pad and a second terminal electrically connected to a second conductive pad.

* * * * *